(12) United States Patent
Yamanaka et al.

(10) Patent No.: US 6,677,194 B2
(45) Date of Patent: Jan. 13, 2004

(54) METHOD OF MANUFACTURING A SEMICONDUCTOR INTEGRATED CIRCUIT DEVICE

(75) Inventors: Toshiaki Yamanaka, Iruma (JP); Akio Nishida, Tachikawa (JP); Yasuko Yoshida, Sayama (JP); Shuji Ikeda, Koganei (JP); Kenichi Kuroda, Tachikawa (JP); Shiro Kamohara, Hachioji (JP); Shinichiro Kimura, Kunitachi (JP); Eiichi Murakami, Tokorozawa (JP); Hideyuki Matsuoka, Nishitokyo (JP); Masataka Minami, Hino (JP)

(73) Assignee: Hitachi, Ltd., Tokyo (JP)

( * ) Notice: Subject to any disclaimer, the term of this patent is extended or adjusted under 35 U.S.C. 154(b) by 33 days.

(21) Appl. No.: 10/162,573

(22) Filed: Jun. 6, 2002

(65) Prior Publication Data
US 2002/0187596 A1 Dec. 12, 2002

(30) Foreign Application Priority Data
Jun. 12, 2001 (JP) ........................................ 2001-176472

(51) Int. Cl.$^7$ ............................................ H01L 21/8238
(52) U.S. Cl. ...................... 438/199; 438/217; 438/276; 438/419; 438/527

(58) Field of Search ................................ 438/197, 199, 438/217, 218, 220, 223, 224, 276, 289, 291, 419, 527

(56) References Cited

U.S. PATENT DOCUMENTS 5,691,225 A * 11/1997 Abiko ........................ 438/199
6,030,862 A * 2/2000 Kepler ........................ 438/217
6,207,510 B1 * 3/2001 Abeln et al. ................. 438/276

* cited by examiner

Primary Examiner—Phat X. Cao
Assistant Examiner—Theresa T. Doan
(74) Attorney, Agent, or Firm—Miles & Stockbridge P.C.

(57) ABSTRACT

A low threshold voltage NMIS area and a high threshold voltage PMIS area are set by a photoresist mask also used for well formation. Using a photoresist mask with openings for the NMIS and PMIS, the NMIS and PMIS areas are set by one ion implantation step. After gate oxidation, ion implantation is conducted through an amorphous silicon film onto wells, channels, and gate electrodes. A plurality of CMIS threshold voltages can be set and the gate electrodes of both polarities can be formed in a reduced number of steps using photoresist. This solves the problem in which photomasks are required as many as there are ion implantation types for wells, channel stoppers, gate electrodes, and threshold voltage control and hence the number of manufacturing steps and the production cost are increased.

22 Claims, 23 Drawing Sheets

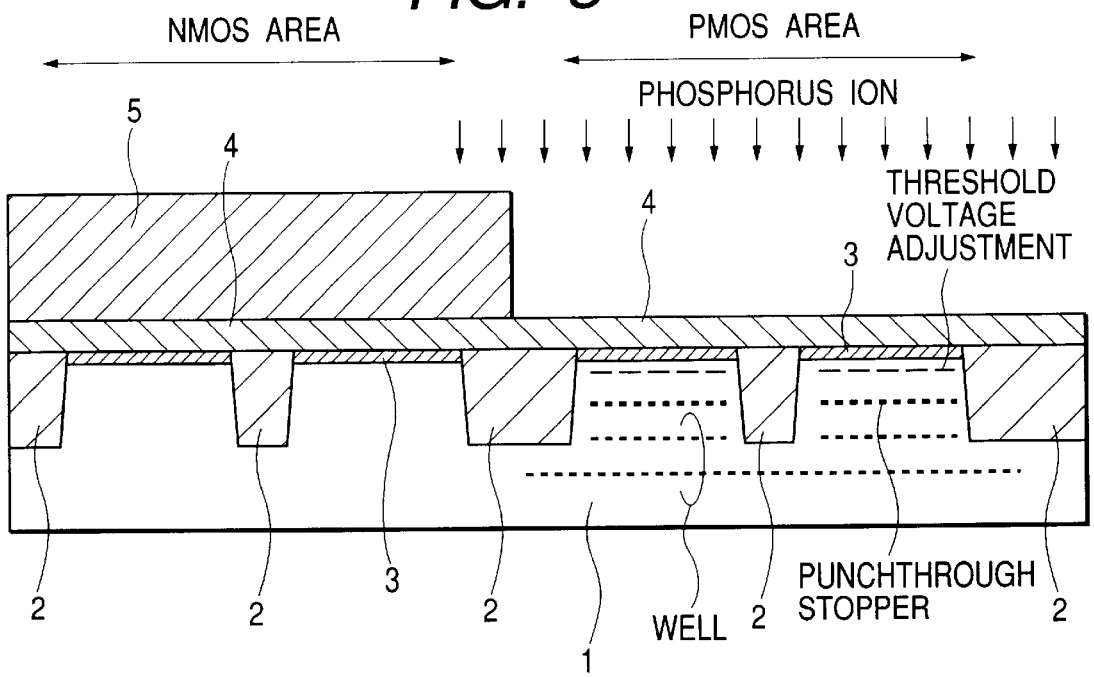
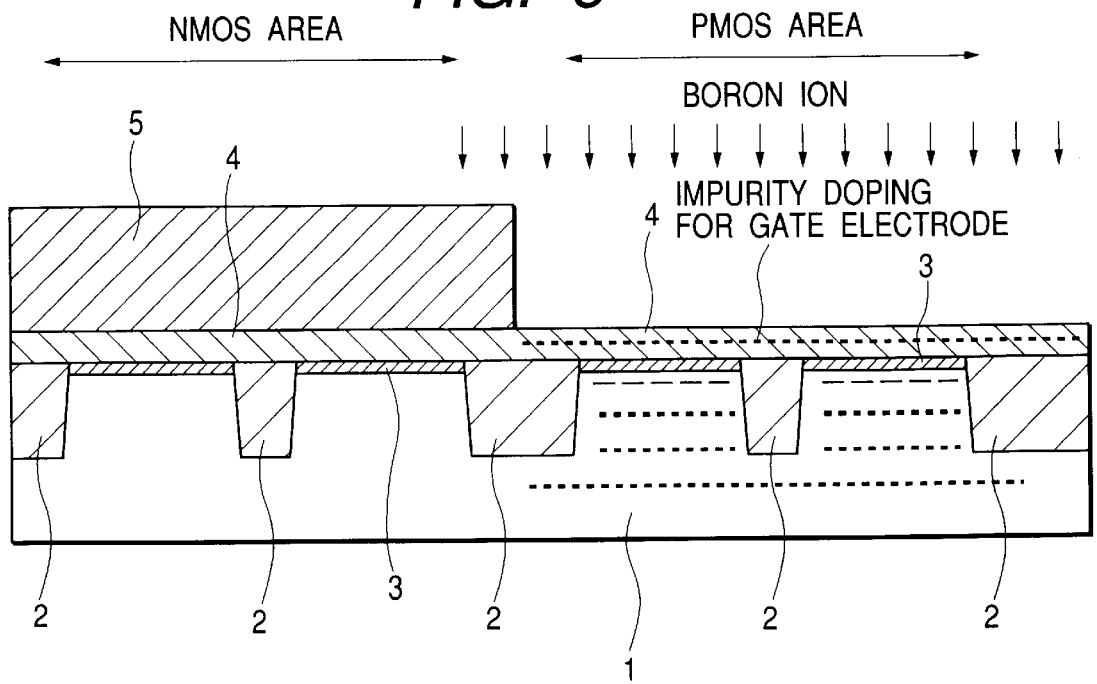

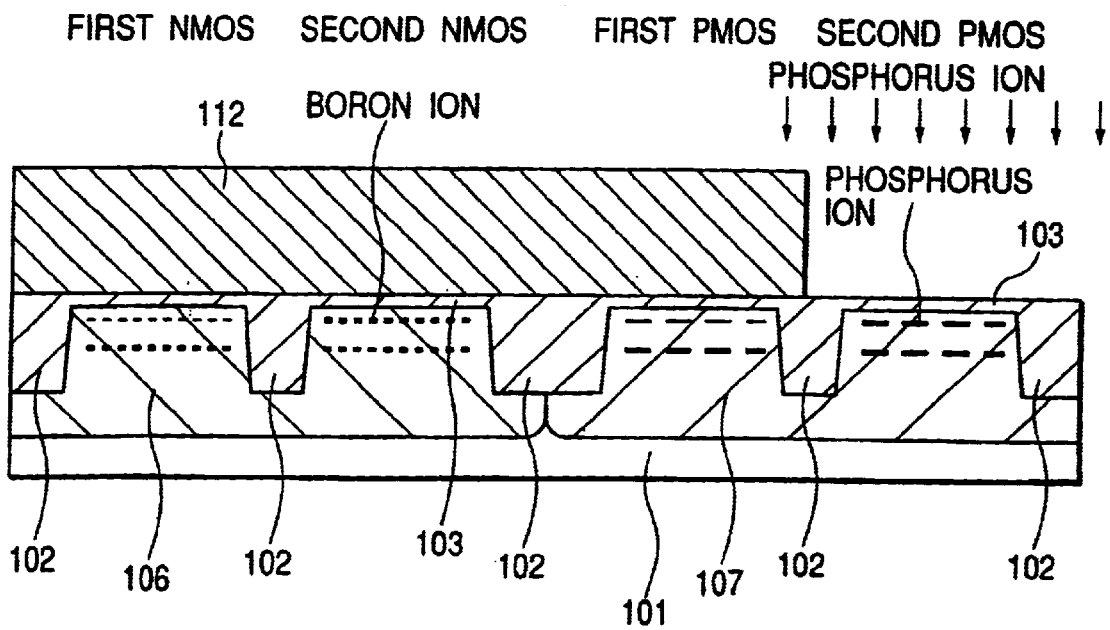
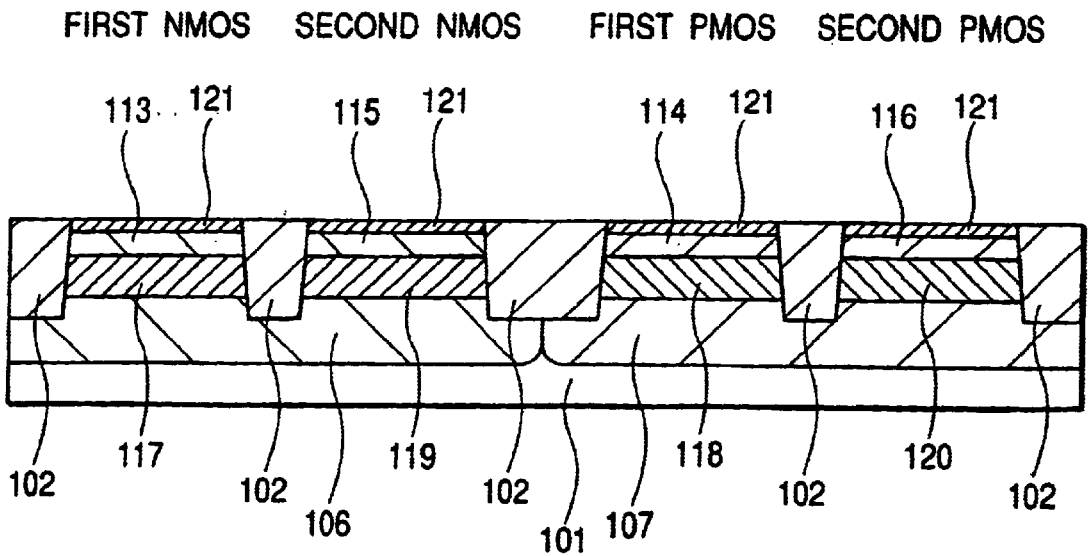

METHOD OF MANUFACTURING A SEMICONDUCTOR INTEGRATED CIRCUIT DEVICE

BACKGROUND OF THE INVENTION

The present invention relates to a method of manufacturing a semiconductor integrated circuit device including a complementary metal insulator semiconductor transistor (CMIS), and in particular, to a method of manufacturing a semiconductor integrated circuit device in which doping steps for wells, channels, and gate electrodes are conducted using a reduced number of photomasks.

Heretofore, the ion implantation steps for wells and channels are conducted before deposition of materials for gate electrodes. Therefore, in the manufacturing of the CMIS, after photolithography is achieved to implant ions in the wells and the channels, photolithography for ion implantation of the gate electrodes must be conducted for each transistor areas respectively of the n-type and p-type channels.

Referring next to FIGS. 33 to 47, description will be given of a doping technique for wells, channels, and gate electrodes of the prior art according to examples of methods of manufacturing semiconductor integrated circuit devices respectively including n-type MIS (NMIS) and p-type MIS (PMIS) transistors each of which has two kinds of threshold voltages.

On one surface of a silicone substrate 101, a field oxide film 102 to isolate transistors from each other is formed, for example, by trench isolation. On the oxide film 102, an about 15 nanometer (nm) thick sacrificial oxide film 103 is formed. Using first photoresist as a mask 104, boron ions are implanted with an impurity density of $5 \times 10^{12}/\text{cm}^2$ onto first and second NMIS transistor forming areas (FIG. 33). After removing the first photoresist 104, phosphorus ion implantation is conducted with an impurity density of about $5 \times 10^{12}/\text{cm}^2$ onto first and second PMIS transistor forming areas using second photoresist 105 as a mask (FIG. 34). After removing the photoresist 105, a predetermined activation step is conducted in nitrogen ambient at about 900° C. to respectively form p-type wells 106 and n-type wells 107 (FIG. 35).

Using third photoresist 108 and the field oxide film 102 as a mask, boron ion implantation is conducted with an impurity density of about $1 \times 10^{13}/\text{cm}^2$ onto punchthrough stopper forming areas of the first and second NMIS transistors (FIG. 36). Using the third photoresist 108 and the field oxide film 102 as a mask, boron ions are implanted with an impurity density of about $7 \times 10^{12}/\text{cm}^2$ onto channel areas of the transistors to control a threshold voltage of the first NMIS transistor (FIG. 37).

In a similar manner as for the NMIS transistors, the third photoresist 108 is first removed and then phosphorus ion implantation is conducted with an impurity density of about $1 \times 10^{13}/\text{cm}^2$ onto punchthrough stopper forming areas of the first and second PMIS transistors using fourth photoresist 110 and the field oxide film 102 as a mask. Using the fourth photoresist 110 and the field oxide film 102 as a mask, phosphorus ion implantation is conducted with an impurity density of about $7 \times 10^{12}/\text{cm}^2$ onto channel areas of the transistors to control a threshold voltage of the first PMIS transistor (FIG. 38).

Thereafter, the fourth photoresist 110 is removed. Using fifth photoresist 111 and the field oxide film 102 as a mask, boron ions are implanted with an impurity density of about $1 \times 10^{13}/\text{cm}^2$ onto the second NMIS transistor forming area up to a depth of a channel area to control a threshold voltage of the second NMIS transistor (FIG. 39).

The fifth photoresist 111 is then removed. Using sixth photoresist 112 and the field oxide film 102 as a mask, phosphorus ion implantation is conducted with an impurity density of about $1 \times 10^{13}/\text{cm}^2$ onto the second PMIS transistor forming area up to a depth of a channel area to control a threshold voltage of the second PMIS transistor (FIG. 40).

After removing the sixth photoresist 112, a predetermined annealing step is conducted to activate a doped area 113 to control the threshold voltage of the first NMIS transistor, a doped area 114 to control the threshold voltage of the first PMIS transistor, a doped area 115 to control the threshold voltage of the second NMIS transistor, a doped area 116 to control the threshold voltage of the second PMIS transistor, a doped area 117 for a channel stopper of the first NMIS transistor, a doped area 118 for a channel stopper of the first PMIS transistor, a doped area 119 for a channel stopper of the second NMIS transistor, and a doped area 120 for a channel stopper of the second PMIS transistor.

The sacrificial oxidation film 103 is removed using hydrofluoric acid solution, and a gate insulation film 121 is then formed by thermal oxidation at about 850° C. (FIG. 41). An about 200 nm thick polycrystalline silicon or polysilicon film 122 is deposited thereon by chemical vapor deposition (CVD) (FIG. 42). Using seventh photoresist 123 as a mask, a phosphorus doping step is conducted with an impurity concentration of about $1 \times 10^{15}/\text{cm}^2$ or more onto the film 122 of the NMIS transistor area (FIG. 43). The seventh photomask 123 is then removed. Using eighth photoresist 124 as a mask, a boron doping step is conducted with an impurity concentration of about $1 \times 10^{15}/\text{cm}^2$ or more onto the film 122 of the PMIS transistor area (FIG. 44).

Through a predetermined annealing step, the polycrystalline silicon film 122 in the NMIS area becomes an n-type polycrystalline silicon film 123 and the polycrystalline silicon film 122 in the PMIS area becomes a p-type polycrystalline silicon film 124. A barrier metal film 125 of, for example, wolfram nitride and a refractory metal film 126 of, for example, wolfram are sequentially deposited thereon by sputtering (FIG. 45).

By photolithography and dry etching, gate electrode patterns are formed in the multilayer film or the lamination of the n-type polycrystalline silicon film 123, the wolfram nitride layer 125, and the wolfram layer 126 of the NMIS area as well as the lamination or the multilayer film of the p-type polycrystalline silicon film 124, the wolfram nitride layer 125, and the wolfram layer 126 of the PMIS area (FIG. 46).

Finally, an arsenic ion implantation is conducted onto the NMIS area to produce an n-type highly doped area 127 and a boron ion implantation is conducted onto the PMIS area to produce a p-type highly doped area 128 (FIG. 47).

SUMMARY OF THE INVENTION

In the CMIS transistor manufacturing method of the prior art as described above, six kinds of photoresist are required in the impurity doping steps for wells, channels, and gate areas. Additionally, when two types of threshold voltages are set respectively for the NMIS and for the PMIS, eight kinds of photoresist are required. Since many photolithography steps are necessary, a long period of time is required to manufacture the semiconductor integrated circuit device and the production cost is increased.

To solve the problem, there is provided according to one aspect of the present invention a method of manufacturing a semiconductor integrated circuit device including a semiconductor substrate and at least one first transistor having a first conductivity type and at least one second transistor having a second conductivity type opposite to the first conductivity type, the first and second transistors being formed on the semiconductor substrate. The method comprises a step of forming a gate insulating film on one surface of the semiconductor substrate, a step of depositing a gate material film using material for gates on the gate insulating film, a step of forming first photoresist covering a second area in which the second transistor is formed, the first photoresist having an opening in a first area in which the first transistor is formed; a step of conducting ion implantation using the first photoresist as a mask for formation of a well, threshold voltage control, and gate doping of the first transistor, a step of removing the first photoresist, a step of forming second photoresist covering the first area and having an opening in the second area, a step of conducting ion implantation using the second photoresist as a mask for formation of a well, threshold voltage control, and gate doping of the second transistor; and a step of removing the second photoresist.

According to another aspect of the present invention, there is provided a method of manufacturing a semiconductor integrated circuit device including a semiconductor substrate and at least one NMIS transistor and at least one PMIS transistor formed on the semiconductor substrate. The method comprises a step of forming a gate insulating film on one surface of the semiconductor substrate, a step of depositing a silicon thin film using silicon, a step of conducting ion implantation, using first photoresist as a mask, to form a p-type well in an NMIS transistor area, a step of conducting ion implantation, using the first photoresist as a mask, onto an NMIS transistor area for threshold voltage control, a step of conducting ion implantation, using the first photoresist as a mask, to implant n-type ions onto the silicon thin film in an NMIS transistor area, a step of removing the first photoresist, a step of conducting ion implantation, using second photoresist as a mask, to form an n-type well in a PMIS transistor area, a step of conducting ion implantation, using the second photoresist as a mask, onto a PMIS transistor area for threshold voltage control, a step of conducting ion implantation, using the second photoresist as a mask, to implant p-type ions onto the silicon thin film in a PMIS transistor area, a step of removing the second photoresist, and a step of patterning a gate electrode in the silicon thin film.

In the methods of manufacturing a semiconductor integrated circuit device according to the aspects of the present invention, only two photolithography steps are required for the impurity doping of wells, channels, and gate areas of the CMIS transistors. This advantageously prevents increase in the manufacturing period of time and the production cost of the semiconductor integrated circuit device.

According to further another aspect of the present invention, there is provided a method of manufacturing a semiconductor integrated circuit device including a semiconductor substrate, first and second NMIS transistors having different threshold voltages and first and second PMIS transistors having different threshold voltages formed on the semiconductor substrate. The method comprises a step of forming a gate insulating film on one surface of the semiconductor substrate, a step of depositing a silicon thin film using silicon, a step of covering with first photoresist areas in which the first and second NMIS transistors are formed, a step of conducting ion implantation, using the first photoresist as a mask, to implant n-type impurity onto the first and second PMIS transistor forming areas, a step of conducting ion implantation, using the first photoresist as a mask, to implant n-type impurity onto channel forming areas of the first and second PMIS transistors, a step of implanting p-type impurity onto the silicon thin film using the first photoresist as a mask, a step of removing the first photoresist, a step of covering with second photoresist areas in which the first and second PMIS transistors are formed, a step of conducting ion implantation, using the second photoresist as a mask, to implant p-type impurity onto the first and second NMIS transistor forming areas, a step of conducting ion implantation, using the second photoresist as a mask, to implant p-type impurity onto channel forming areas of the first and second NMIS transistors, a step of implanting n-type impurity onto the silicon thin film using the second photoresist as a mask, a step of removing the second photoresist, a step of covering with third photoresist areas in which the first NMIS transistor and the first PMIS transistor are formed, a step of implanting p-type impurity onto the channel forming areas of the second NMIS and PMIS transistors using the third photoresist as a mask, and a step of removing the third photoresist.

In the method of manufacturing a semiconductor integrated circuit device, only three photolithography steps are required for the impurity doping of wells, channels, and gate areas of the CMIS transistors each of which includes NMIS transistors having two kinds of threshold voltages and PMIS transistors having two kinds of threshold voltages. This remarkably reduces the manufacturing period of time and the production cost of the semiconductor integrated circuit device.

Other objects, features and advantages of the invention will become apparent from the following description of the embodiments of the invention taken in conjunction with the accompanying drawings.

BRIEF DESCRIPTION OF THE DRAWINGS

FIGS. 2 to 13 are cross-sectional views for explaining steps of manufacturing the first embodiment of the semiconductor integrated circuit device according to the present invention.

FIGS. 33 to 47 are cross-sectional views for explaining steps of manufacturing a semiconductor integrated circuit device of the prior art.

DESCRIPTION OF THE EMBODIMENTS

Next, description will be given in detail of an embodiment of a method of manufacturing a semiconductor integrated circuit according to the present invention.

First Embodiment

Figure 1:
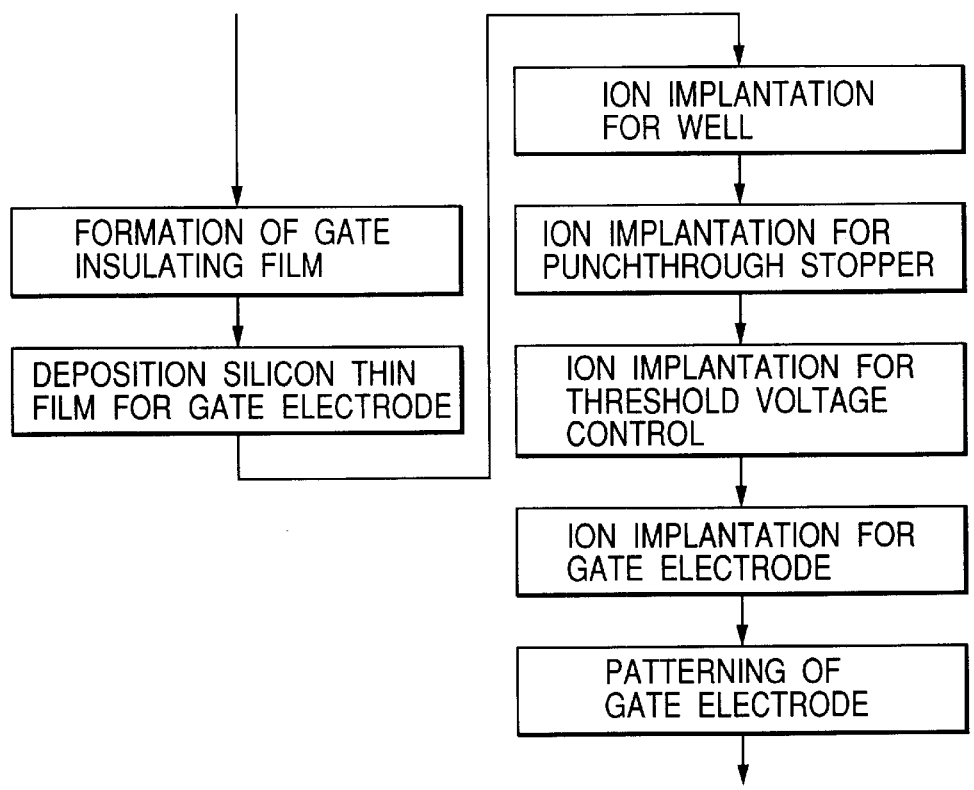
FIG. 1 is a flowchart showing steps of manufacturing a semiconductor integrated circuit device in a first embodiment of the present invention.

FIG. 1 schematically shows a first embodiment of the present invention. The first embodiment of a method of manufacturing a semiconductor integrated circuit includes the steps of gate insulation film formation and deposition of gate electrode silicon thin film and includes thereafter the steps of well ion implantation using a photoresist mask, punchthrough stopper ion implantation using a photoresist mask, threshold voltage control ion implantation using a photoresist mask, gate electrode ion implantation using a photoresist mask, and gate electrode patterning.

Referring now to FIGS. 2 to 14, the first embodiment will be described in detail. In the embodiment, two NMIS transistors and two PMIS transistors are configured.

Figure 2:
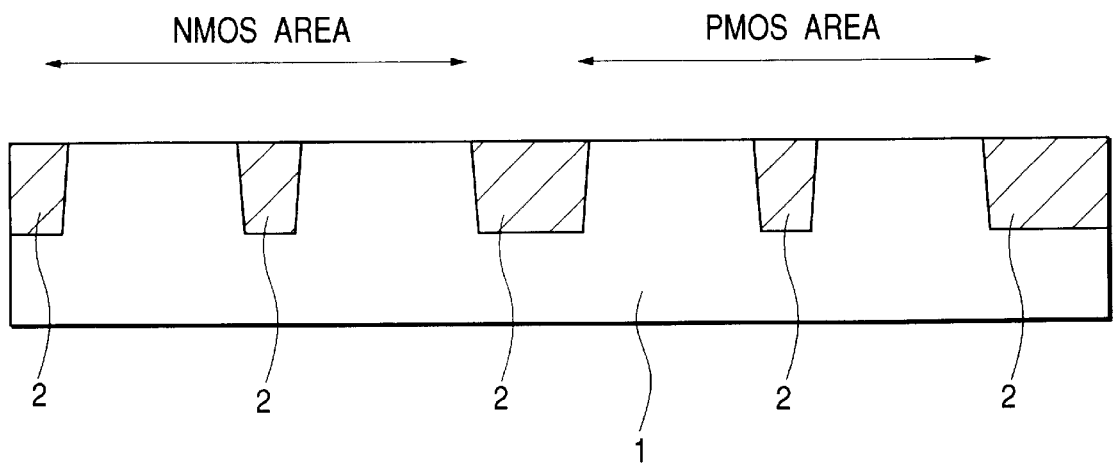
Figure 3:
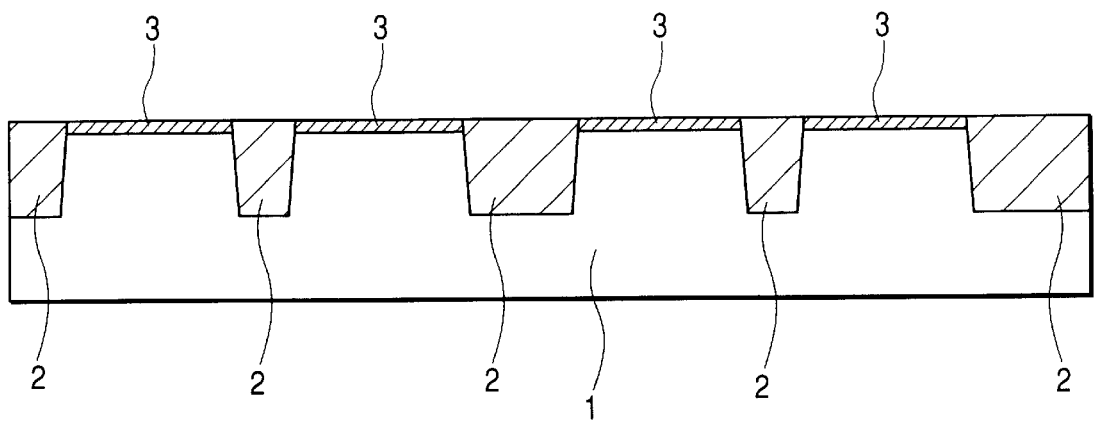
Figure 4:
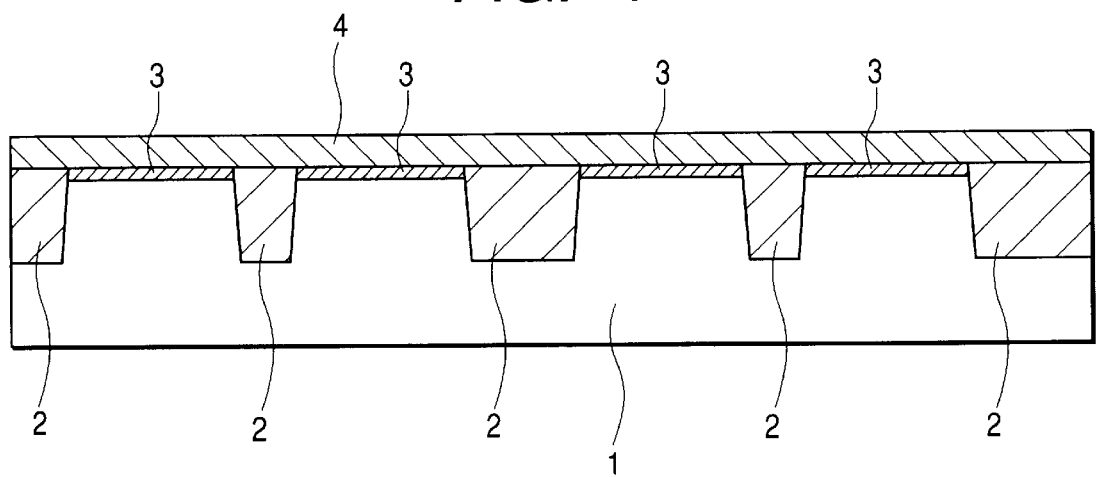

First, a field oxide film 2 is formed on a semiconductor substrate 1 using the known technique. To form the film 2, trench isolation is employed in place of a local oxidation of silicon (LOCOS) method. The trench isolation is not associated with a problem of birds beak and is effective for device separation of 0.2 micrometer ($\mu$m) or less. Specifically, an about 0.3 $\mu$m deep silicon trench is formed. The trench is then filled with a silicon oxide film having good step coverage to be thereafter planarized by chemical mechanical polishing (FIG. 2). An about 3 nm thick gate oxide film 3 is then formed (FIG. 3). On the film 3, an about 40 nm thick amorphous silicon film 4 is deposited by known low pressure CVD (FIG. 4).

To form n-type wells, phosphorous ion implantation is conducted onto PMIS transistor areas using photoresist 5 over NMIS transistor areas as a mask. The ion implantation to form the well is desirably conducted several times with mutually different acceleration energy. Ion implantation conditions are, for example, energy of 200 kiloelectronvolt (keV) for a dosage of $1\times10^{13}/cm^2$ and 120 keV for a dosage of $5\times10^{12}/cm^2$. For punchthrough stoppers of the PMIS transistors, phosphorous ions are implanted thereonto using the photoresist 5 and the field oxide film 2 as a mask under an ion implantation condition of, for example, 60 keV for a dosage of $1\times10^{13}/cm^2$. Using the photoresist 5 and the field oxide film 2 as a mask, phosphorous ion implantation is conducted thereonto for threshold voltage control of the PMIS transistors under an ion implantation condition of, for example, 30 keV energy for a dosage of $3\times10^{12}/cm^2$ (FIG. 5). In the step, the ion implantation condition is desirably set to appropriate values according to thickness of the amorphous silicon layer.

For the doping of gate areas of the PMIS transistors, boron ions are implanted onto the amorphous silicon 4 in the PMIS transistor areas using the photoresist 5 as a mask under ion implantation condition of, for example, 15 keV for a dosage of $5\times10^{15}/cm^2$ (FIG. 6).

However, the sequence of the ion implantation steps may be appropriately changed.

The NMIS transistors are constructed in almost the same way as for the PMIS transistors.

Figure 7:
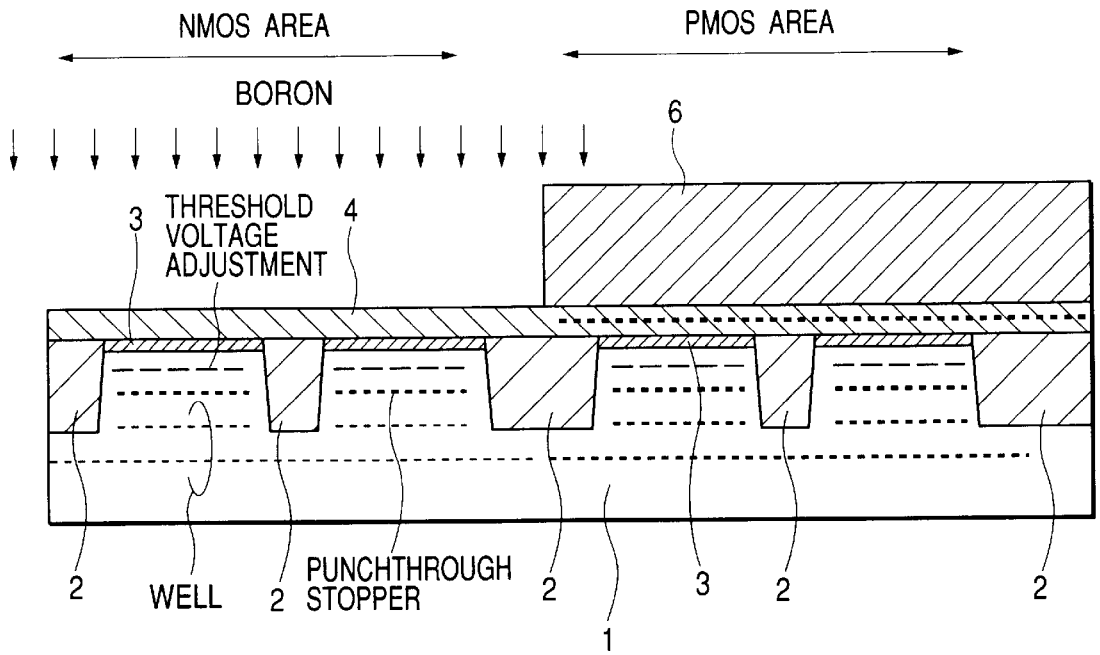

First, to form p-type wells, boron ions are implanted onto PMIS transistor areas using photoresist 6 over PMIS transistor areas as a mask. The ion implantation is desirably conducted several times with mutually different acceleration energy. Ion implantation conditions are, for example, 150 keV for a dosage of $1\times10^{13}/cm^2$ and 80 keV for a dosage of $5\times10^{12}/cm^2$. For punchthrough stoppers of the NMIS transistors, boron ions are implanted thereonto using the photoresist 6 and the field oxide film 2 as a mask under an ion implantation condition of, for example, 40 keV for a dosage of $1\times10^{13}/cm^2$. Using the photoresist 6 and the field oxide film 2 as a mask, boron ion implantation is conducted thereonto for threshold voltage control of the NMIS transistors under an ion implantation condition of, for example, 15 keV for a dosage of $3\times10^{12}/cm^2$ (FIG. 7). As in the manufacturing of the PMIS transistors, the ion implantation condition is desirably set to appropriate values according to thickness of the amorphous silicon layer.

Figure 8:
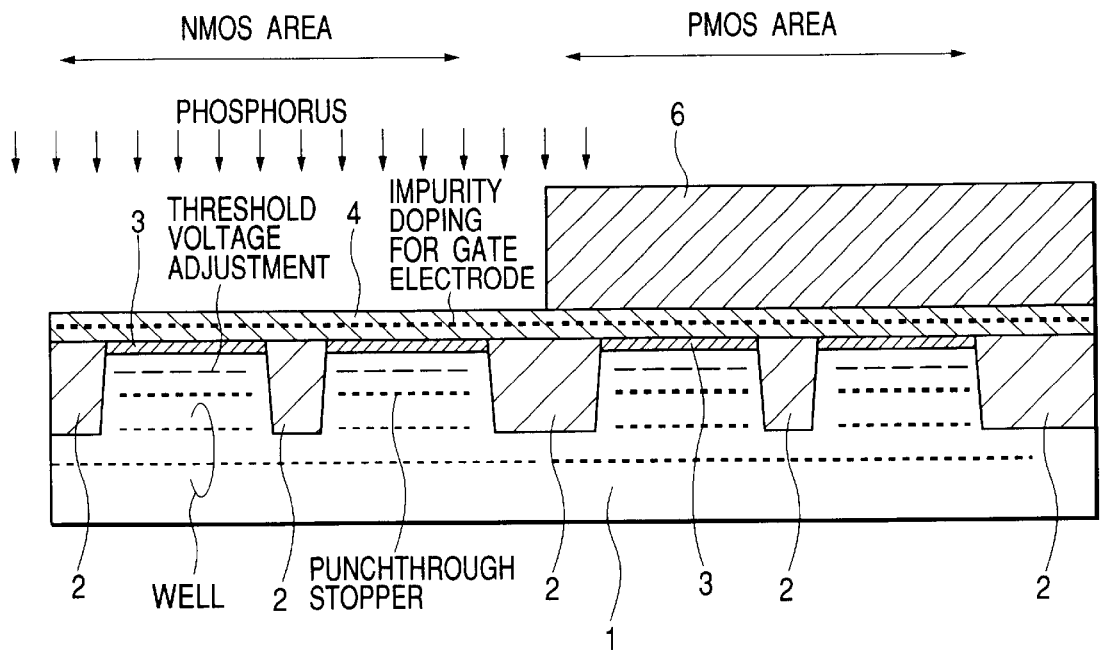

For the doping of gate areas of the NMIS transistors, phosphorous ions are implanted onto the amorphous silicon 4 in the NMIS transistor areas using the photoresist 6 as a mask under ion implantation condition of, for example, 10 keV for a dosage of $5\times10^{15}/cm^2$ (FIG. 8). The ion implantation condition is set to appropriate values according to thickness of the amorphous silicon layer.

In the ion implantation for the doping of the gate areas, an about 10 nm silicon oxide film may be formed on the amorphous silicon 4. In place of the amorphous silicon film, a polycrystalline silicon film may be employed. The sequence of the ion implantation steps may be appropriately changed.

Figure 9:
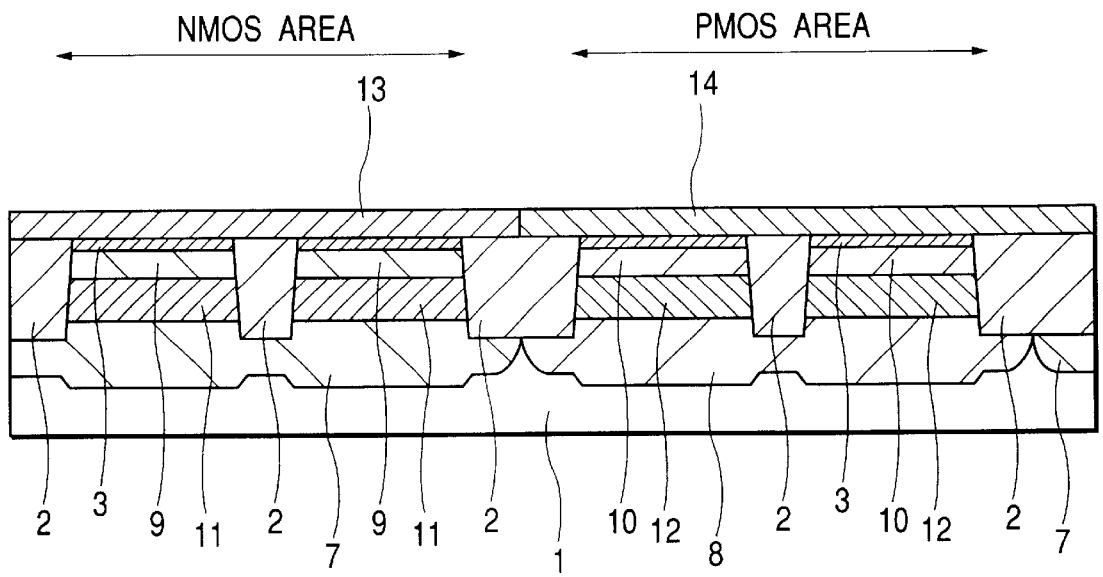

After removing the photoresist 6, the ion implanted layer is activated at a time by annealing in nitrogen ambient at about 900° C. to form a p-type well 7 of each NMIS transistor, an ion implanted layer 9 for threshold voltage control, a punchthrough stopper layer 11, and n-type polysilicon 13 (n-type gate doping) as well as an n-type well 8 of each PMIS transistor, an ion implanted layer 10 for threshold voltage control, a punchthrough stopper layer 12, and p-type polysilicon 14 (p-type gate doping; FIG. 9).

Figure 10:
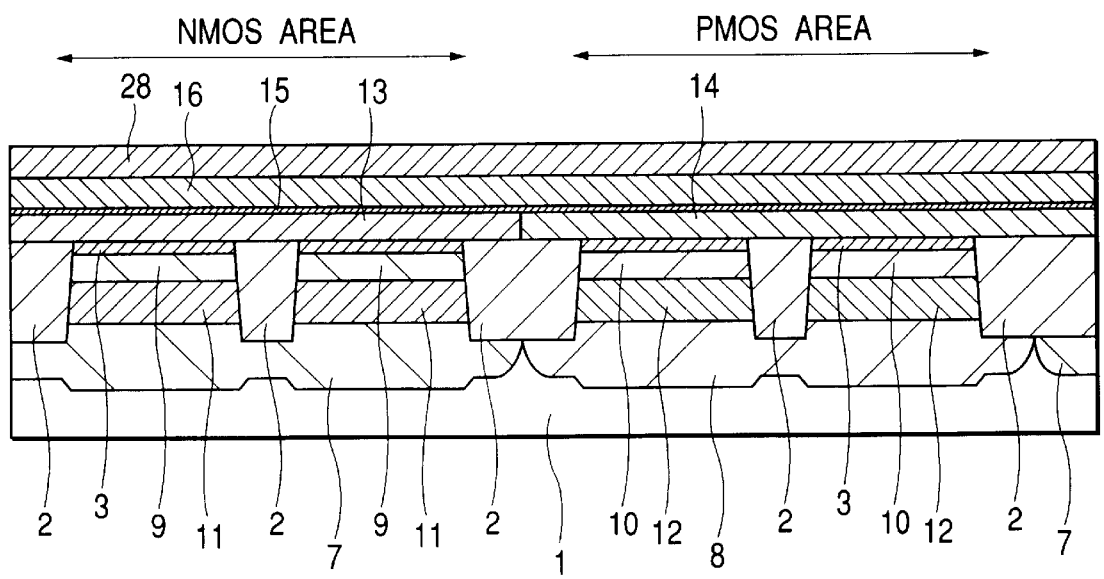

An about 5 nm thick barrier metal film of, for example, wolfram nitride 15 is deposited thereon by sputtering, a refractory metal film of, for example, wolfram 16 is deposited thereon by sputtering, and a silicon nitride film 28 is deposited by LPCVD to cap wolfram electrodes (FIG. 10). Titanium nitride may also be used for the barrier metal film. To cap the electrodes, silicon oxide may be used in place of silicon nitride.

Figure 11:
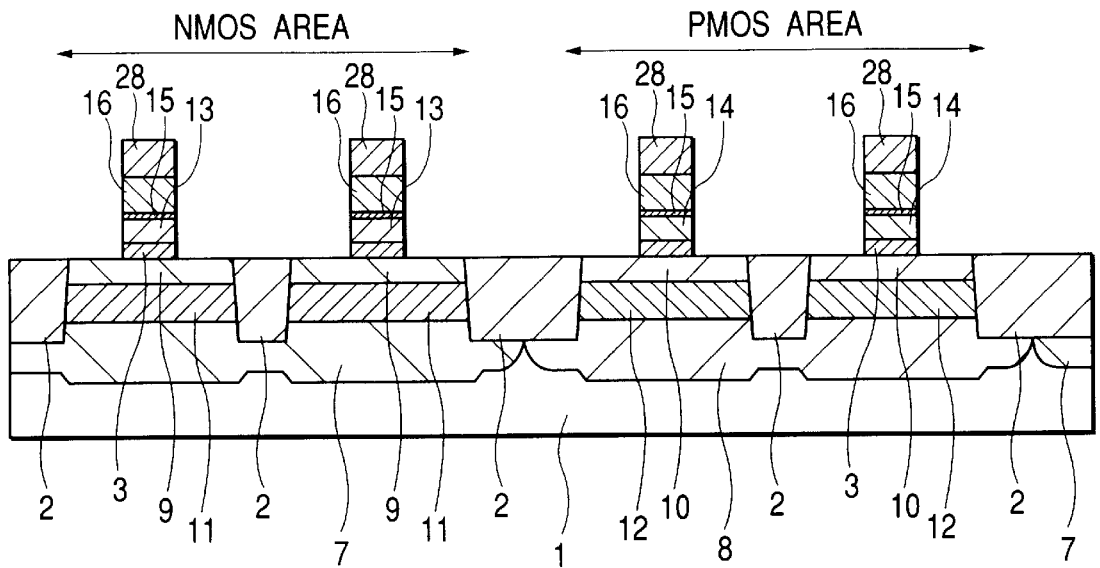

The multilayer film including the amorphous silicon layer 4, the wolfram nitride layer 15, the wolfram layer 16, and the silicon nitride film 28 is patterned by photolithography and dry etching (FIG. 11).

Figure 12:
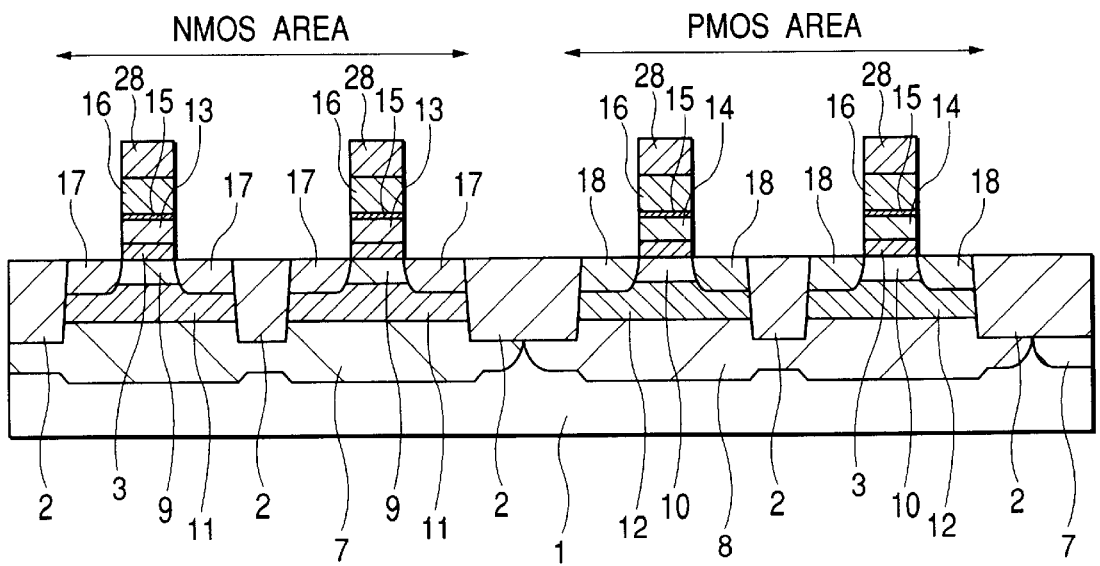

By ion implantation thereon using photoresist as a mask and by annealing thereafter, an extension (n-type doped area) 17 of each NMIS transistor and an extension (p-type doped area) 18 of each PMIS transistor are formed (FIG. 12). The ion implantation dosage is about $1\times10^{15}/cm^2$.

Figure 13:
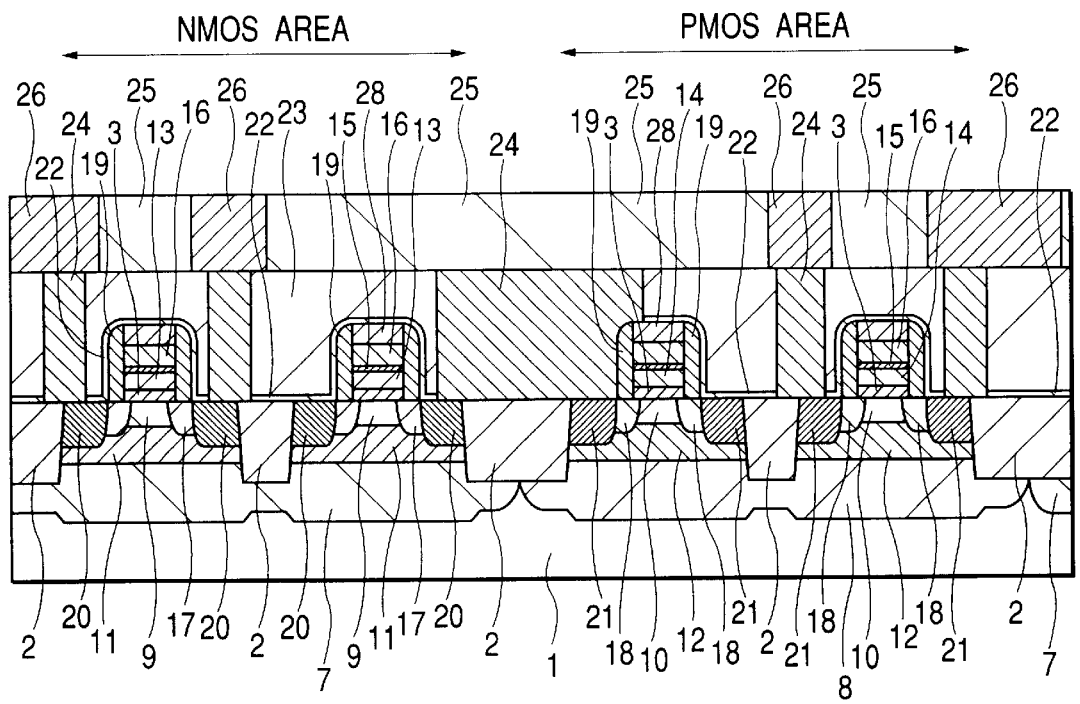

Side wall spacers 19 of the silicon nitride film are formed by isotropic etch back. Using photoresist and the sidewall spacers 19 as a mask, a highly doped n-type area 20 is formed in each NMIS transistor area and a highly doped p-type area 21 is formed in each PMIS area. Ion implantation dosage is about $3\times10^{15}/cm^2$, and an annealing step is conducted for a short period of about ten seconds in nitrogen ambient at about 900° C. The sidewall spacer is from about 50 nm to about 100 nm long and may be formed using a silicon oxide film. An about 50 nm thick silicon nitride film is then formed on an overall surface thereof by CVD, a silicon oxide film 23 with a thickness of about 1 $\mu$m is deposited thereof, and its surface is planarized by CMP. To deposit the silicon oxide film 23, it is desirable to employ ozone TEOS and CVD using high-density plasma for a favorable gap filling characteristic. Thereafter, openings are arranged for contact holes in the multilayer film of the silicon oxide film 23 and the silicon nitride film 22. The holes are filled with wolfram 24 having a thickness of about 200 nm. The wolfram 24 in the planarized areas is polished by CMP to resultantly form plug electrodes. The openings of the contact holes may be disposed on the sidewall spacers 19 and the gate electrode pattern. Moreover, the opening may be formed astride the field oxide film 2 so that the opening is shared between the adjacent MIS transistors. A silicon oxide film 25 is then deposited thereon and then copper wiring 26 is formed in the silicon oxide film 25 by a damascene method (FIG. 13). The embodiment includes damascene wiring made of copper. However, aluminum electrodes may be dry-etched to form the wiring.

Figure 14:
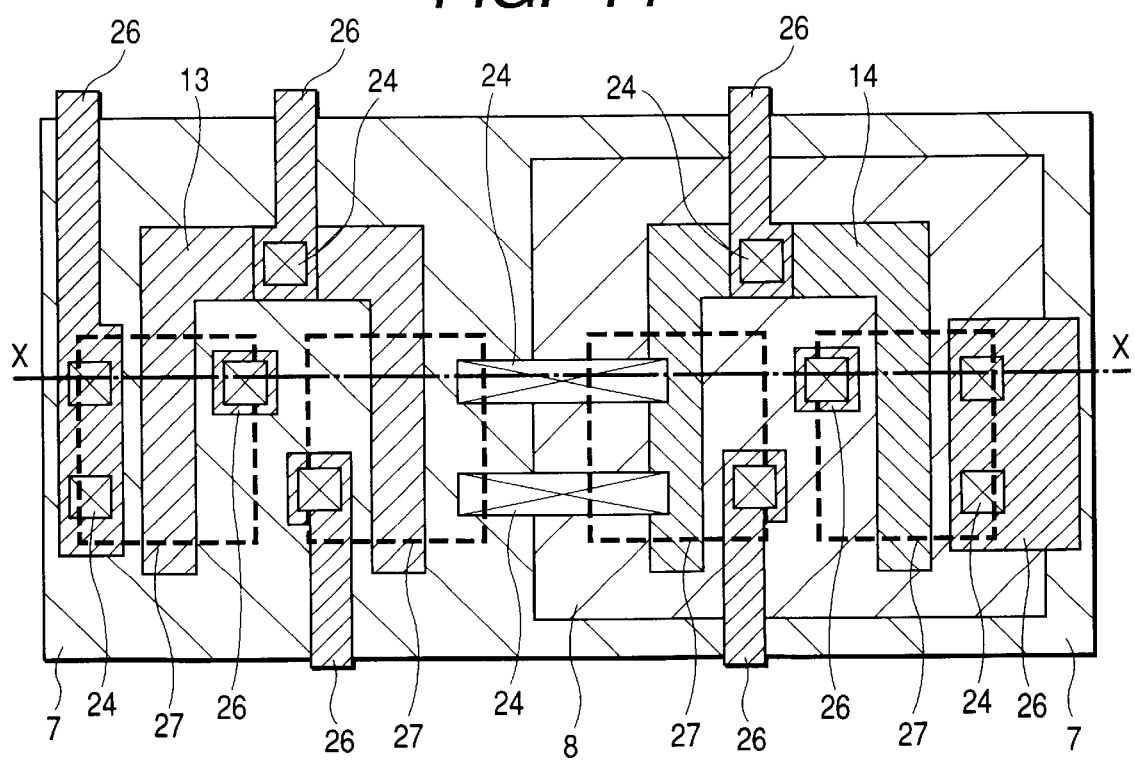
FIG. 14 is a plan view showing the first embodiment of the semiconductor integrated circuit device according to the present invention.

In the description of the embodiment, FIGS. 2 to 13 show cross-sectional views along line X–X' of FIG. 14 and a reference numeral 27 indicates a boundary of a filed oxide film. In the embodiment, n-type polysilicon is used for the NMIS transistor and a p-type polysilicon is used in the PMIS transistor. However, by using another photomask in the doping of the gate electrode, it is possible that part or all of the NMIS transistor is made of p-type polysilicon and part or all of the PMIS transistor is make of n-type polysilicon. For the gate electrode doping, an n-type or a p-type doping step may be employed without using the doping photomask. In place of the ion implantation, gas-phase or solid-phase diffusion may also be used in the gate electrode doping step.

In the embodiment, the n-type wells of the PMIS transistors are first formed. However, it is possible to first form the p-type wells of the NMIS transistors. The forming sequence of the n-type and p-type wells can be determined according to conditions of the production line such as a photomask change sequence and a change sequence of source gas in an ion implanter.

According to the embodiment, only one photolithography step is required for the wall ion implantation, the channel ion implantation for threshold voltage control, and the ion implantation for the gate electrode doping, and hence the LSI manufacturing steps can be reduced. Since the multilayer film of the silicon thin film and a thin film of low-resistance metal can be used to form the gate electrode, it is possible to fabricate a finer gate with reduced resistance. Therefore, a highly integrated and highly efficient semiconductor integrated circuit device can be provided. As shown in FIGS. 13 and 14, since the contact hole is formed to overlap with the field oxide film 2 and the gate electrode pattern, a high-density LSI device can be provided.

Second Embodiment

In the second embodiment, resistance is reduced in a source-drain area and a gate electrode of the MIS transistor.

The second embodiment will be described in detail by referring to FIGS. 15 to 19. The manufacturing steps including deposition of amorphous silicon 4 on a gate electrode film 3 and formation of a p-type well 7 of an NMIS transistor, an ion implanted layer 9 for threshold voltage control, a punchthrough stopper layer 11, n-type polysilicon 13 (n-type gate doping) and an n-type well 8 of a PMIS transistor, an ion implanted layer 10 for threshold voltage control, a punchthrough stopper layer 12, and p-type polysilicon 14 (p-type gate doping) are substantially equal to those of the first embodiment shown in FIGS. 2 to 9. The amorphous silicon layer 4 favorably has a thickness of from about 100 nm to about 200 nm. The amorphous silicon 4 is activated and is thereafter processed into n-type polysilicon 13 and p-type polysilicon 14.

Figure 15:
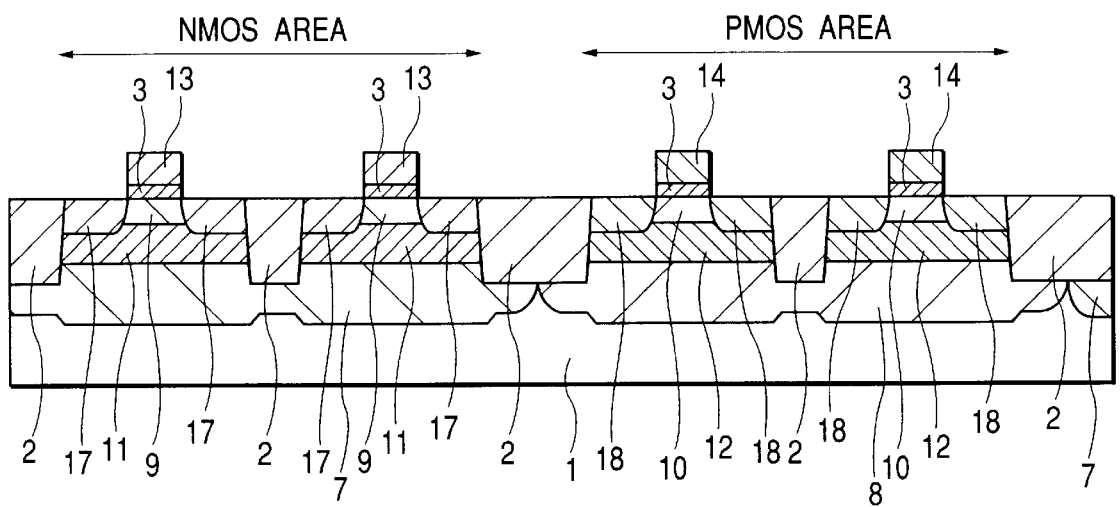
FIGS. 15 to 19 are cross-sectional views for explaining steps of manufacturing a second embodiment of a semiconductor integrated circuit device according to the present invention.

After patterning the n-type polysilicon 13 and the p-type polysilicon 14 by photolithography and dry etching, ion implantation and annealing are conducted thereon using photoresist as a mask to form an extension (n-type doped area) 17 of the NMIS transistor and an extension (p-type doped area) 18 of the PMIS transistor (FIG. 15). The dosage of ion implantation is about $1 \times 10^{15}/cm^2$.

Figure 16:
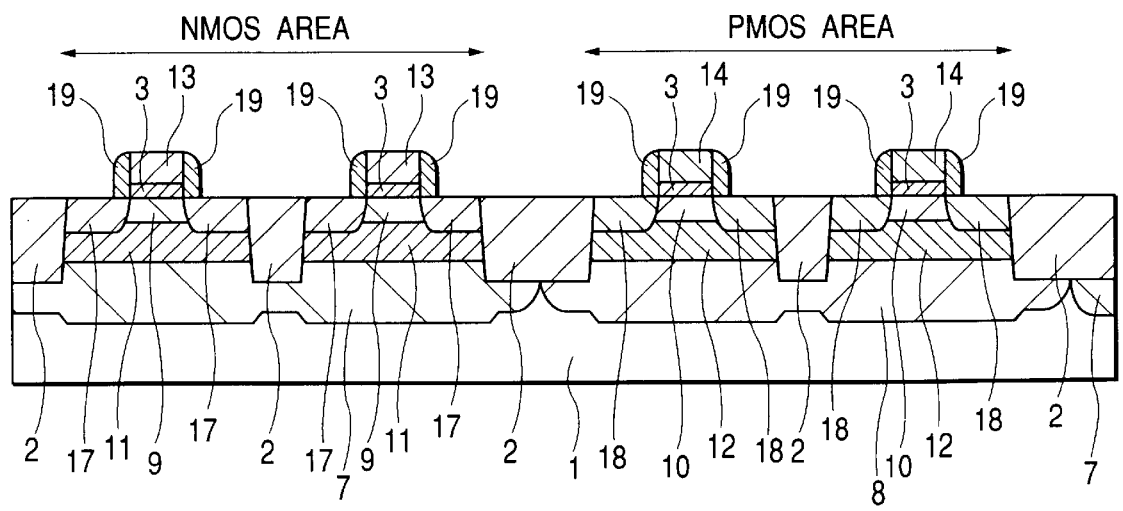

Next, sidewall spacers 19 of the silicon nitride film are formed by isotropic etch back (FIG. 16).

Figure 17:
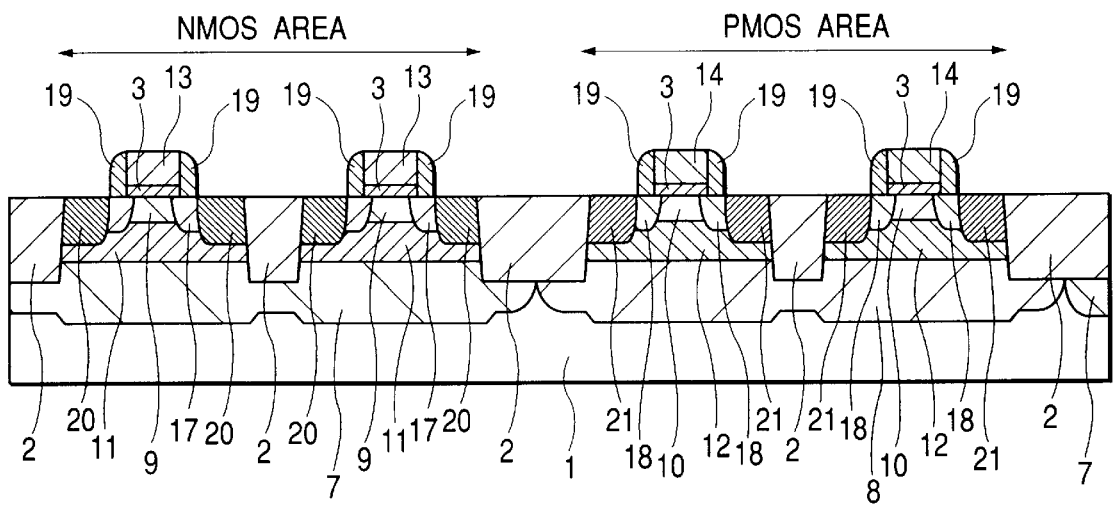

Using photoresist and the sidewall spacers 19 as a mask, ion implantation is conducted thereon to form a high-density n-type area 20 in the NMIS area and a high-density p-type area 21 in the PMIS area with a dosage of about $3 \times 10^{15}/cm^2$. Thereafter, short-time annealing is conducted for about ten seconds in nitride ambient at about 900° C. The sidewall spacer is about 50 nm long (FIG. 17).

Figure 18:
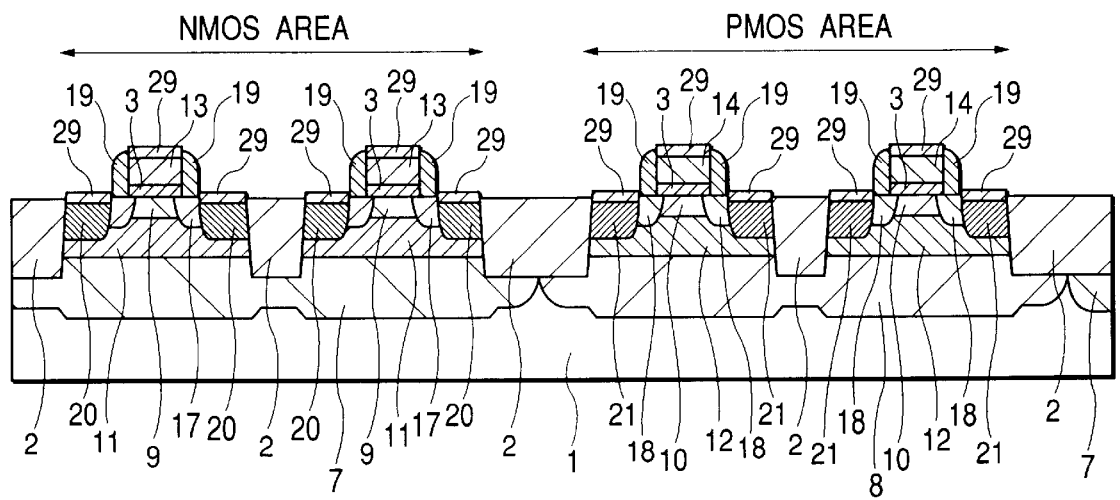

An about 30 nm thick cobalt layer is deposited thereon and a predetermined annealing step is conducted to form cobalt silicide 29 on the high-density n-type area 20, the high-density p-type area 21, the n-type polysilicon 13, and the p-type polysilicon 14 in a self-aligning manner (FIG. 18).

Figure 19:
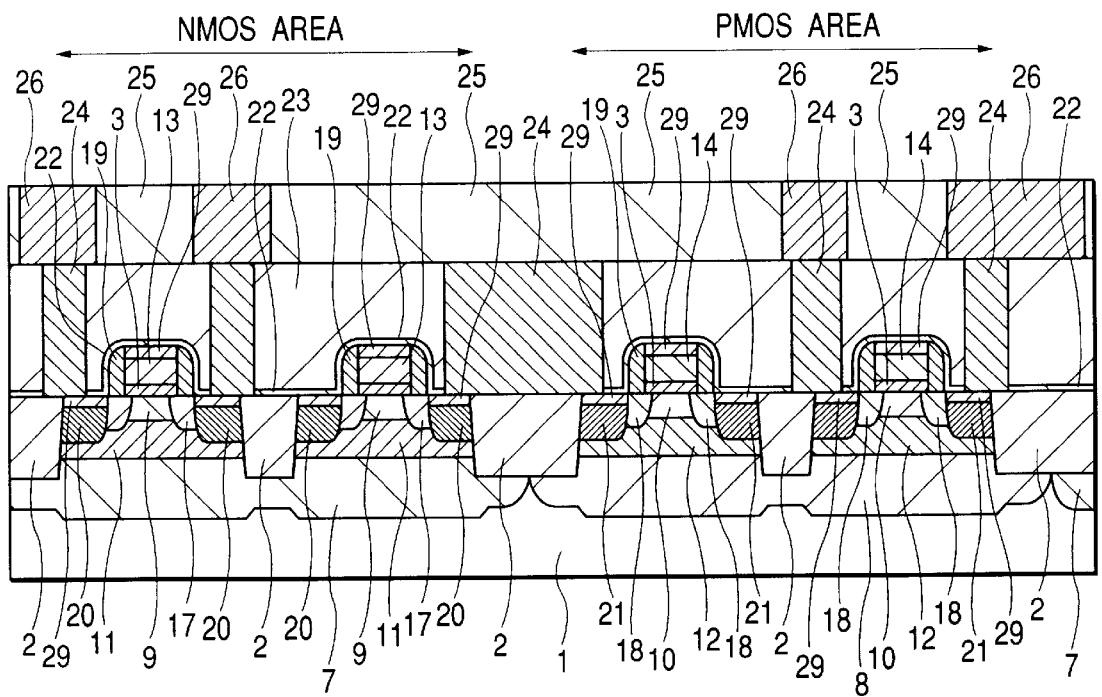

After depositing an about 50 nm thick silicon nitride film thereon, formation of inter-layer or interlevel insulating layers, opening of contact holes, and formation of wiring electrodes are carried out in almost the same way as for the first embodiment shown in FIG. 13 (FIG. 19).

According to the embodiment, in the manufacturing steps of the wall ion implantation, the channel ion implantation for threshold voltage control, and the ion implantation for the gate electrode doping of the present invention, the resistance of the source-drain areas and the gate electrodes can be reduced only by one processing step using cobalt salicide. This advantageously reduces the manufacturing steps of the semiconductor integrated circuit device.

Embodiment 3

In the third embodiment, the polysilicon layer for gate electrodes includes a plurality of layers. The third embodiment will be described in detail by referring to FIGS. 20 to 22. The manufacturing steps including deposition of amorphous silicon 4 on a gate electrode film 3 and formation of a p-type well 7 of an NMIS transistor, an ion implanted layer 9 for threshold voltage control, a punchthrough stopper layer 11, n-type polysilicon (n-type gate doping) 13 and an n-type well 8 of a PMIS transistor, an ion implanted layer 10 for threshold voltage control, a punchthrough stopper layer 12, and p-type polysilicon 14 (p-type gate doping) are substantially equal to those of the first embodiment shown in FIGS. 2 to 9. To conduct the ion implantation for threshold voltage control with low energy, the amorphous silicon layer 4 favorably has a thickness of about 50 nm. There may be used polysilicon produced in LPCVD at a temperature of about 600° C. or more.

Figure 20:
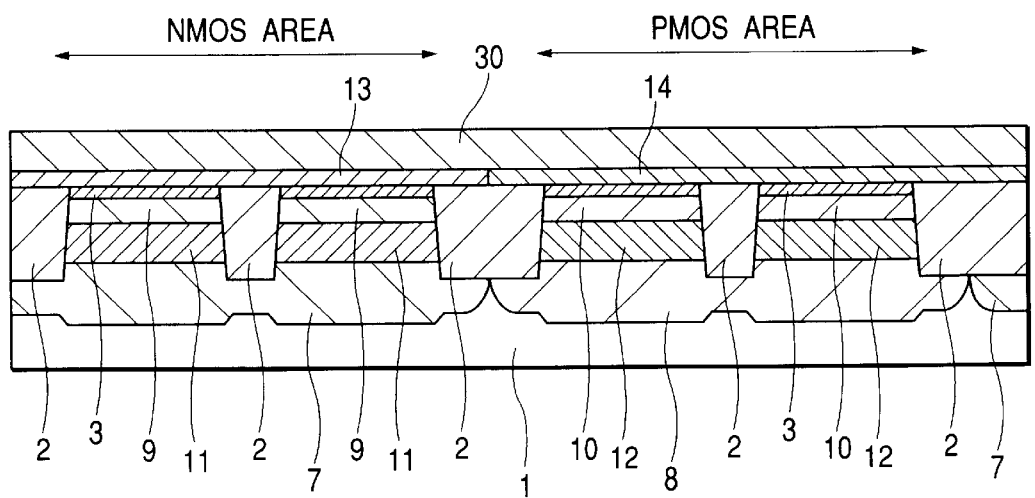
FIGS. 20 to 22 are cross-sectional views for explaining steps of manufacturing a third embodiment of a semiconductor integrated circuit device according to the present invention.

An about 150 nm thick polysilicon layer 30 is deposited thereon by LPCVD. The polysilicon may be produced by LPCVD at a temperature of about 600° C. or less (FIG. 20).

Figure 21:
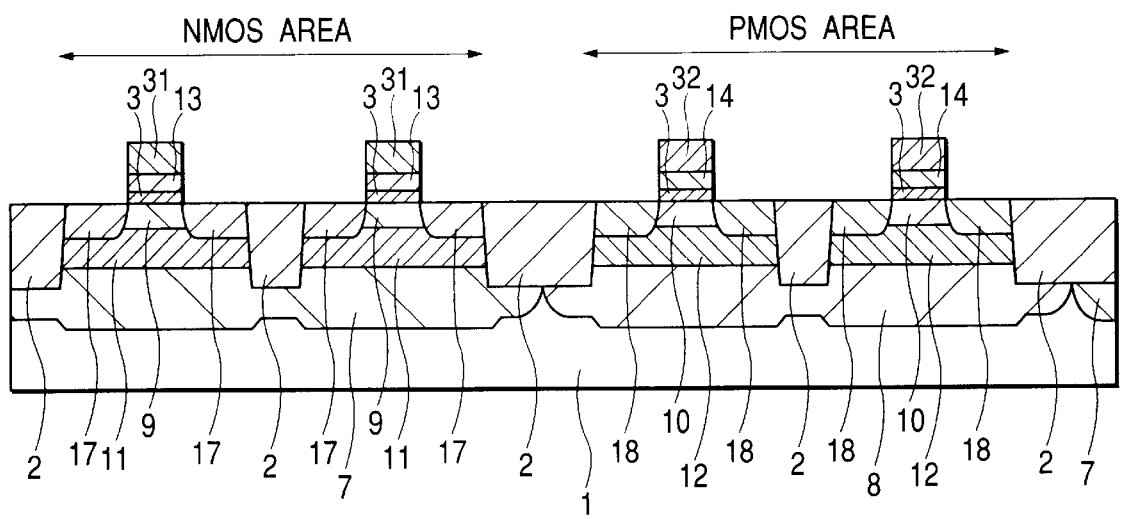

After patterning the n-type polysilicon 13 and the p-type polysilicon 14 by photolithography and dry etching, ion implantation and annealing are conducted thereon using photoresist as a mask to form an extension (n-type doped area) 17 of the NMIS transistor and an extension (p-type doped area) 18 of the PMIS transistor (FIG. 21). The dosage of ion implantation is about $1 \times 10^{15}/cm^2$.

Figure 22:
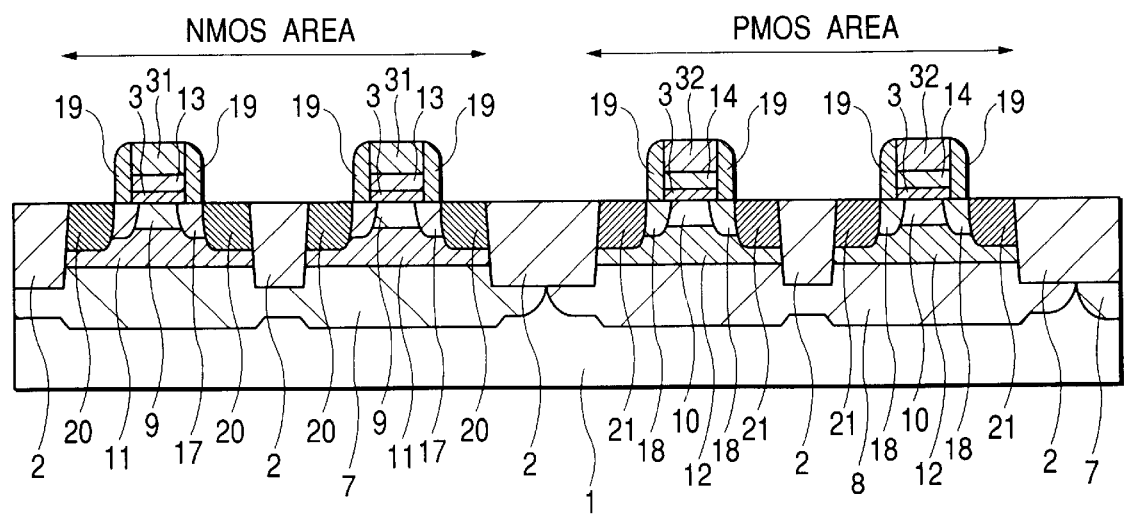

Next, sidewall spacers 19 of the silicon nitride film are formed by isotropic etch back. Using photoresist and the sidewall spacers 19 as a mask, ion implantation is conducted thereon to form a high-density n-type area 20 in the NMIS area and a high-density p-type area 21 in the PMIS area with a dosage of about $3\times10^{15}/cm^2$. Thereafter, short-time annealing is conducted for about ten seconds in nitride ambient at about 900° C. The sidewall spacer is about 50 nm long (FIG. 22).

Reduction of the resistance in the gate electrode of the third embodiment has been described according to the second embodiment. However, the technique is naturally applicable to a gate electrode in a laminated or multilayer configuration including a polysilicon film and a film of refractory metal.

According to the embodiment, since the thickness of the amorphous silicon layer 4 is reduced, the energy used to conduct the ion implantation for threshold voltage control can be lowered. This advantageously reduces the channel length of the MIS transistor. Therefore, a high-performance semiconductor integrated circuit device can be provided.

Fourth Embodiment

In the fourth embodiment, a high-performance MIS transistor is manufactured using a gate insulating film with high permittivity. The embodiment will be described in detail by referring to FIGS. 23 to 27.

Figure 23:
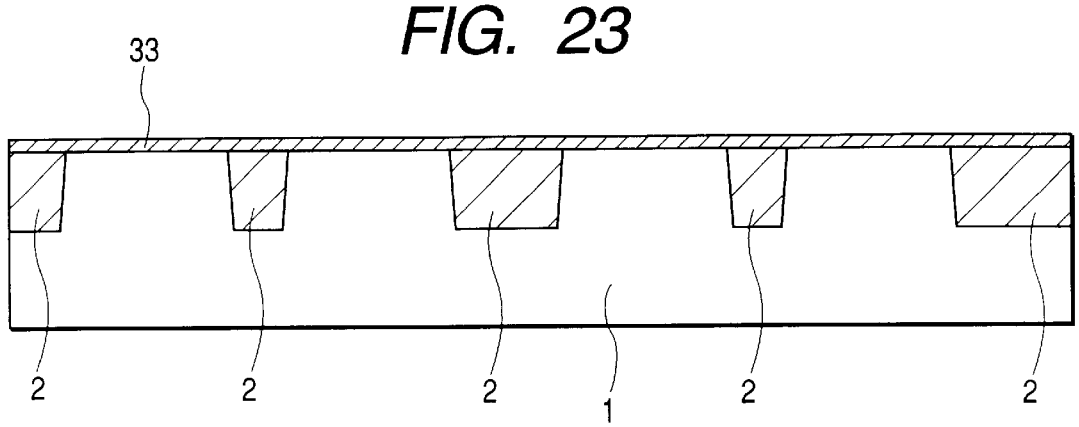
FIGS. 23 to 27 are cross-sectional views for explaining steps of manufacturing a fourth embodiment of a semiconductor integrated circuit device according to the present invention.

The manufacturing steps up to the step to form the field oxide film by shallow trench isolation are almost the same as those of the first embodiment shown in FIG. 2. After the surface of the silicon substrate 1 is washed in a predetermined manner, a high-permittivity insulating film 33 is deposited thereon (FIG. 23). The film is made of, for example, titanium dioxide ($TiO_2$).

Figure 24:
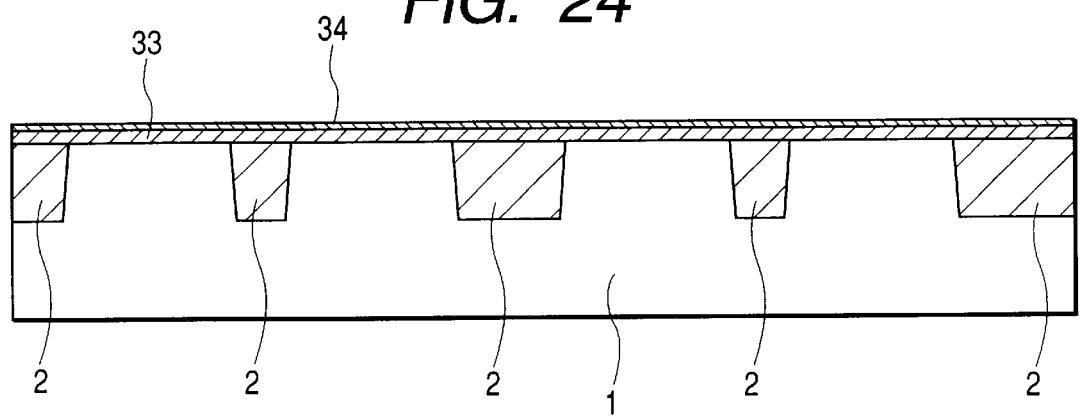

An about 10 nm thick silicon oxide film 34 is then deposited on the high-permittivity insulating film 33 by LPCVD (FIG. 24).

Figure 25:
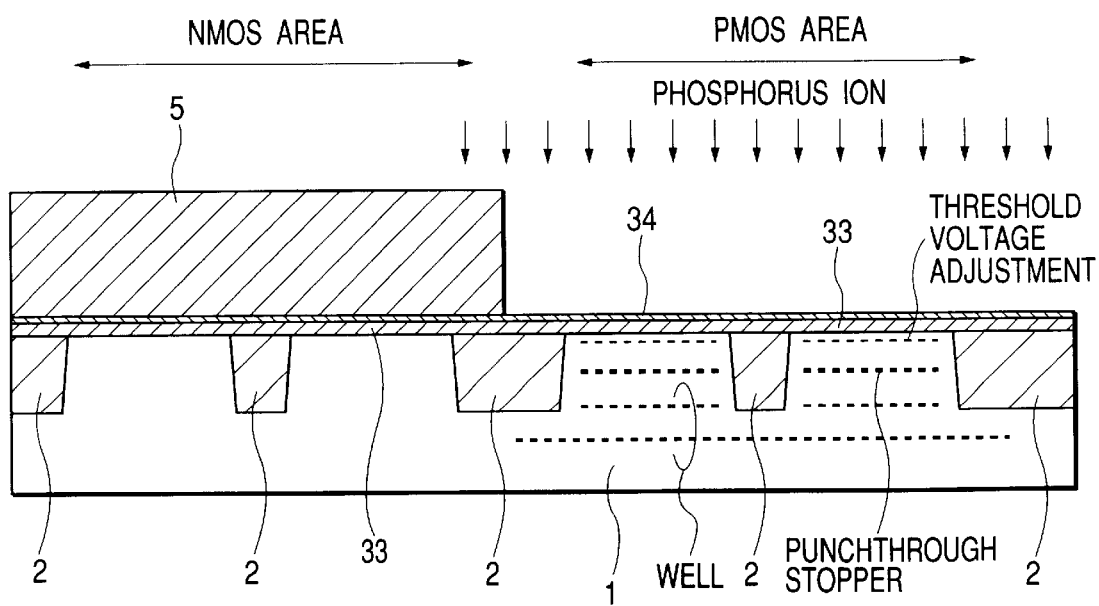

As in the first embodiment, phosphor ions are implanted onto a PMIS transistor area using photoresist 5 as a mask to form an n-type well in a PMIS area. Ion implantation conditions are, for example, energy of 200 keV for a dosage of $1\times10^{13}/cm^2$ and 120 keV for a dosage of $5\times10^{12}/cm^2$. For a punchthrough stopper of the PMIS transistor, phosphorous ions are implanted thereonto using the photoresist 5 and the field oxide film 2 as a mask under an ion implantation condition of, for example, 60 keV for a dosage of $1\times10^{13}/cm^2$. Using the photoresist 5 and the field oxide film 2 as a mask, phosphorous ion implantation is conducted thereonto for threshold voltage control of the PMIS transistor under an ion implantation condition of, for example, 30 keV energy for a dosage of $3\times10^{12}/cm^2$ (FIG. 25). In the operation, the ion implantation condition is desirably set to appropriate values according to thickness of the gate insulating film.

Figure 26:
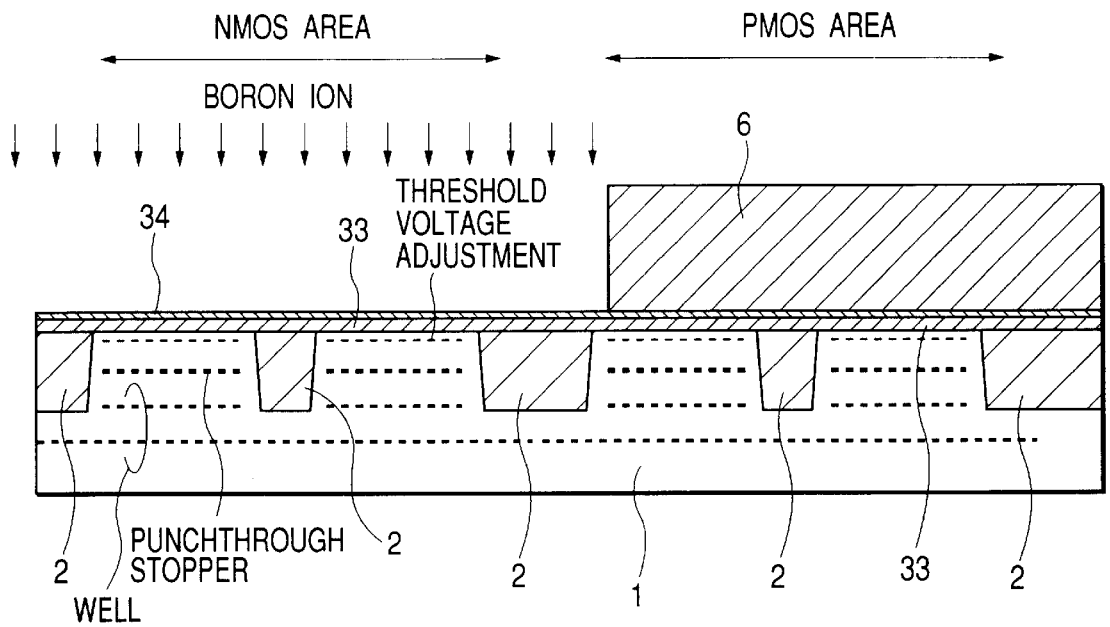

The NMIS transistor is formed in almost the same way as for the PMIS transistor. To form a p-type well, boron ions are implanted onto the PMIS transistor area using photoresist 6 as a mask. Also in this case, the ion implantation is desirably conducted several times with mutually different acceleration energy. Ion implantation conditions are, for example, 150 keV for a dosage of $1\times10^{13}/cm^2$ and 80 keV for a dosage of $5\times10^{12}/cm^2$. For a punchthrough stopper of the NMIS transistor, boron ions are implanted thereonto using the photoresist 6 and the field oxide film 2 as a mask under an ion implantation condition of, for example, 40 keV for a dosage of $1\times10^{13}/cm^2$. Using the photoresist 6 and the field oxide film 2 as a mask, boron ion implantation is conducted thereonto for threshold voltage control of the NMIS transistor under an ion implantation condition of, for example, 15 keV for a dosage of $3\times10^{12}/cm^2$ (FIG. 26). As in the fabrication of the PMIS transistor, the ion implantation condition is desirably set to appropriate values according to thickness of the gate insulating film.

Figure 27:
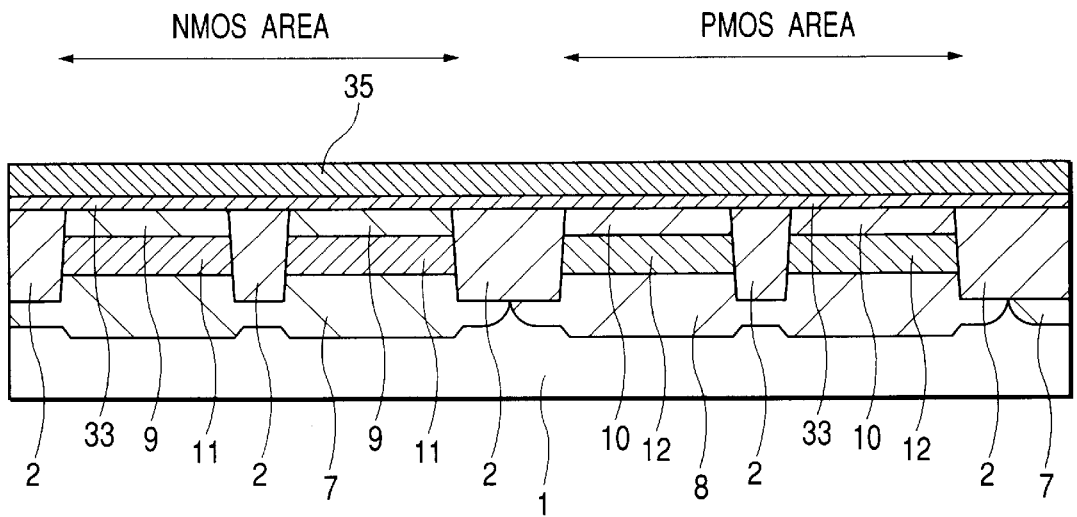

Subsequently, by conducting a predetermined annealing step, a p-type well 7 of the NMIS transistor, an ion implanted layer 9 for threshold voltage control, a punchthrough stopper layer 11, an n-type well 8 of the PMIS transistor, an ion implanted layer 10 for threshold voltage control, and a punchthrough stopper layer 12 are formed. After removing the silicon oxide film 34 in hydrofluoric acid solution, an about 150 nm thick wolfram film 35 is deposited by sputtering (FIG. 27). Although not shown, as an underlie of the wolfram 35, barrier metal such as titanium nitride may be used. In addition to wolfram, low-resistance refractory metal available for dry etching such as molybdenum can also be used.

The subsequent steps such as the etching of the gate electrode and the formation of the extension are conducted in almost the same way as for those of the preceding embodiments.

According to the embodiment, by using the high-transmittivity gate insulating film, performance of the transistors is increased and hence a high-speed semiconductor integrated circuit device can be provided.

Fifth Embodiment

Figure 28:
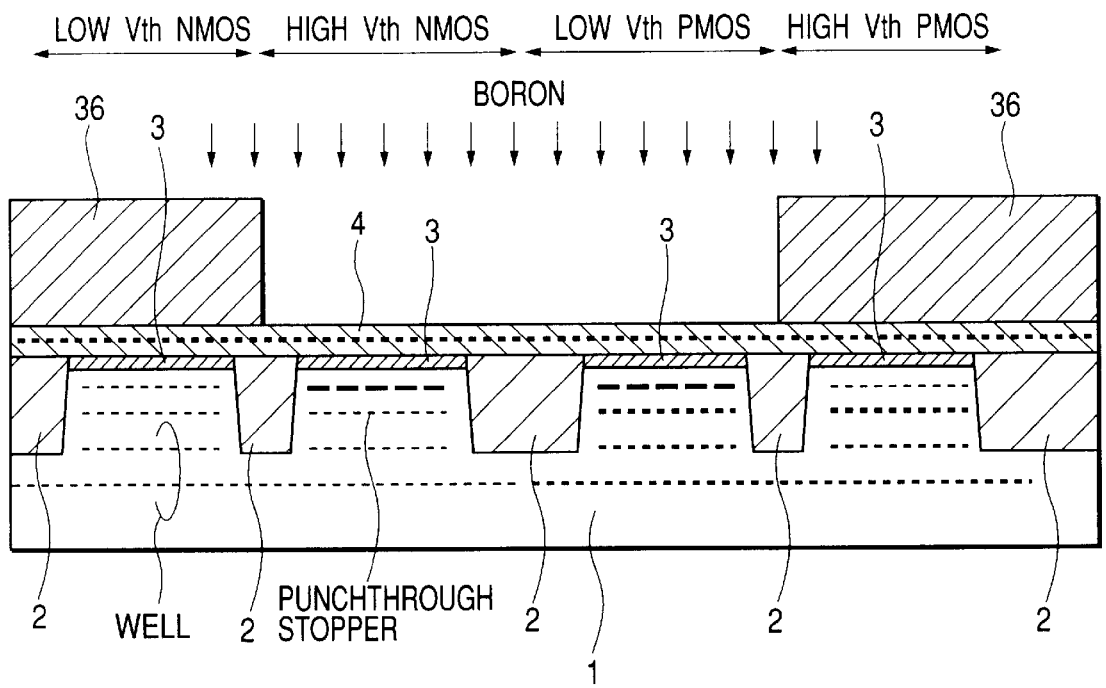
FIGS. 28 and 29 are cross-sectional views for explaining steps of manufacturing a fifth embodiment of the semiconductor integrated circuit device according to the present invention.
Figure 29:
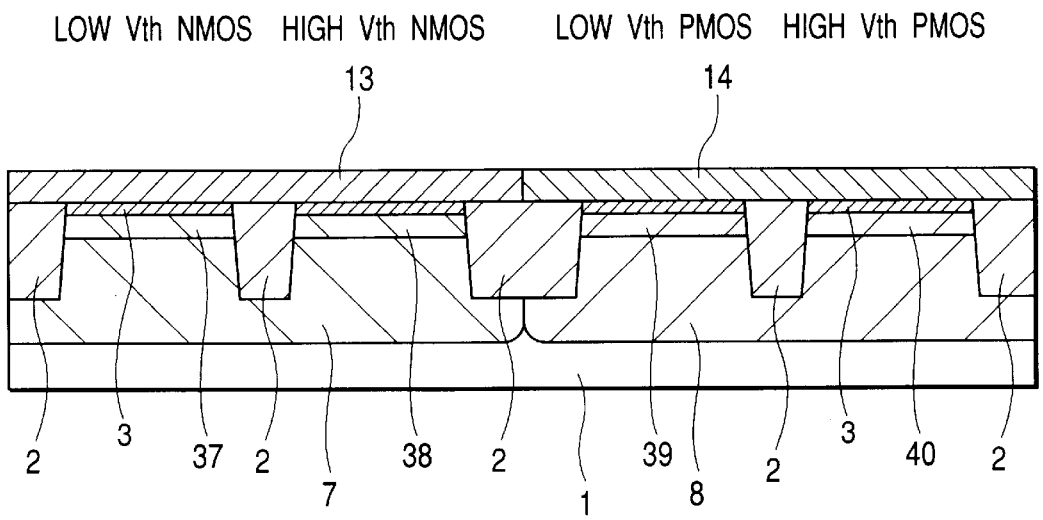

In the fifth embodiment associated with the first embodiment of the manufacturing method, each of the MIS transistors has different threshold voltages. Referring now to FIGS. 28 and 29, the fifth embodiment will be described. In the description of the embodiment, the NMIS transistor has a low threshold voltage (Vth) and a high threshold voltage (Vth), and the PMIS transistor has a low threshold voltage (Vth) and a high threshold voltage (Vth).

The manufacturing steps up to the ion implantation onto the amorphous silicon 4 for the gate electrode are substantially equal to those of the first embodiment shown in FIGS. 1 to 8. In the ion implantation for threshold voltage control in FIGS. 5 and 7, the dosage of ion implantation is set such that the threshold voltage of the NMIS transistor is set to the low value (Vth) and the threshold voltage of the PMIS transistor is set to the high value (Vth). For example, boron ions are implanted onto the NMIS area with a dosage of $2\times10^{12}$ $cm^{-2}$ using the resist mask 6, and ions are implanted onto the PMIS area with a dosage of $4\times10^{12}$ $cm^{-2}$ using the resist mask 5.

Boron ion implantation is conducted using a photoresist 36 onto a high Vth area of the NMIS transistor and a low Vth area of the PMIS transistor under an ion implantation condition of, for example, 15 kev for a dosage of $3\times10^{12}/cm^2$ (FIG. 28).

After removing the photoresist 36, the ion implanted layer is activated at a time by annealing in nitrogen ambient at about 900° C. to form a p-type well 7 of the NMIS transistor, an ion implanted layer 37 for low threshold voltage control, an ion implanted layer 38 for high threshold voltage control, a punchthrough stopper layer, and n-type polysilicon (n-type gate doping) 13 as well as an n-type well 8 of the PMIS transistor, an ion implanted layer 39 for low threshold voltage control, an ion implanted layer 40 for high threshold voltage control, a punchthrough stopper layer, and p-type polysilicon (p-type gate doping) 14 as shown in FIG. 29. The channel stopper layers are not shown in FIG. 29. The subsequent steps such as the formation of the gate electrode, the source and drain formation, and the wiring step are conducted in almost the same way as for those of the first embodiments.

Figure 30:
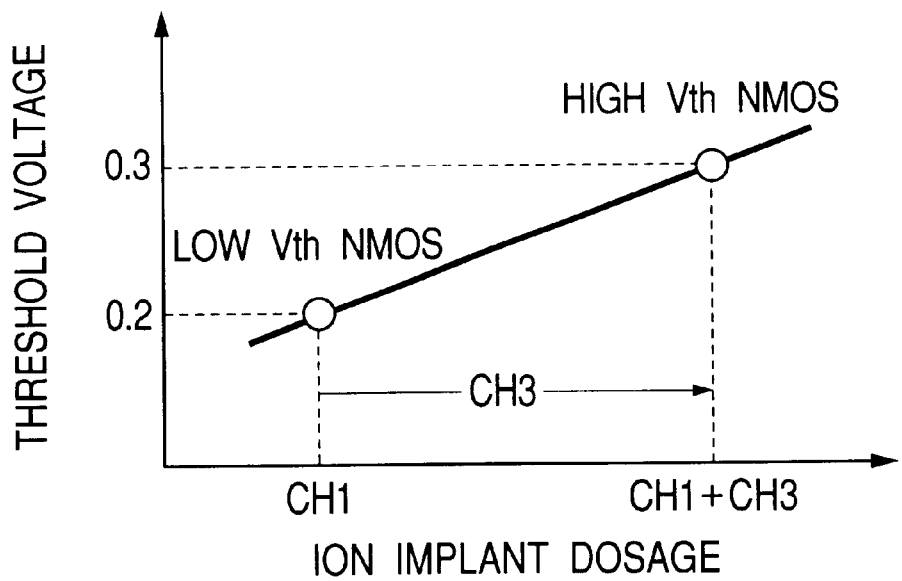
FIGS. 30 and 31 are graphs for explaining advantage of the fifth embodiment according to the present invention.
Figure 31:
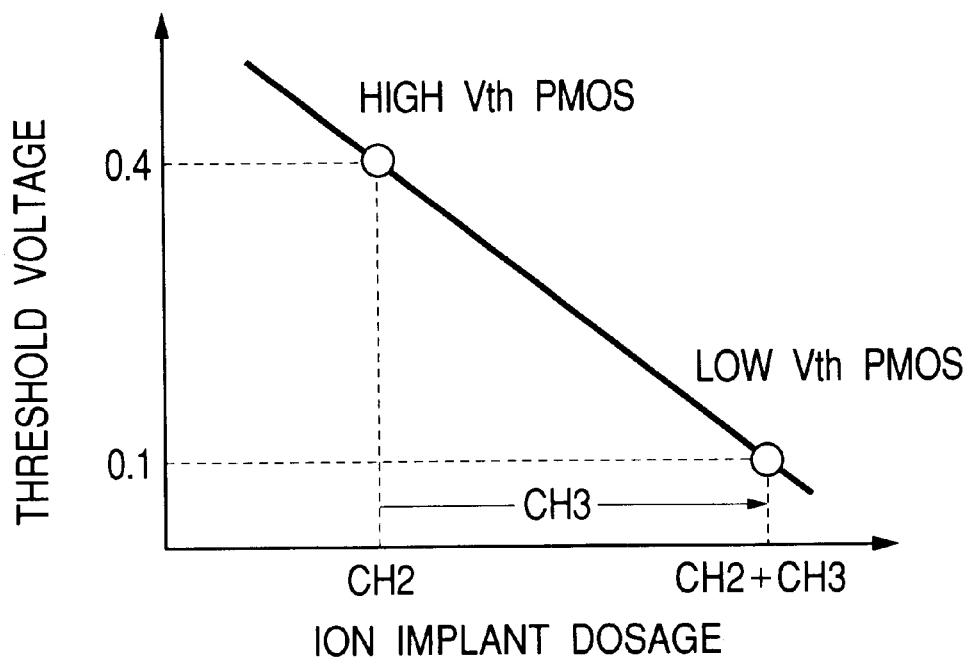

FIGS. 30 and 31 shows kinds of threshold voltages of the CMIS transistor formed according to the present invention.

Referring to FIGS. 30 and 31, description will be given of advantages of the present embodiment. The threshold voltages of the NMIS transistor having a low threshold voltage and the PMIS transistor having a high threshold voltage are respectively set to predetermined values by the ion implantation (CH1 and CH2) onto the associated channel areas using the respective photoresist mask in the formation of the p-type and n-type wells, respectively. Using a photoresist mask 36 having openings for the NMIS transistor and the PMIS transistor, ion implantation (CH3) is conducted onto the channel areas to simultaneously form the NMIS and PMIS transistors.

Figure 32:
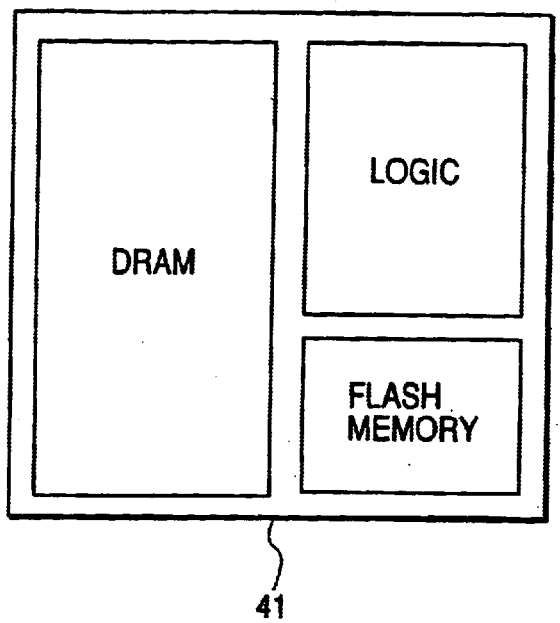
FIG. 32 is a plan view for explaining the fifth embodiment according to the present invention.
Figure 33:
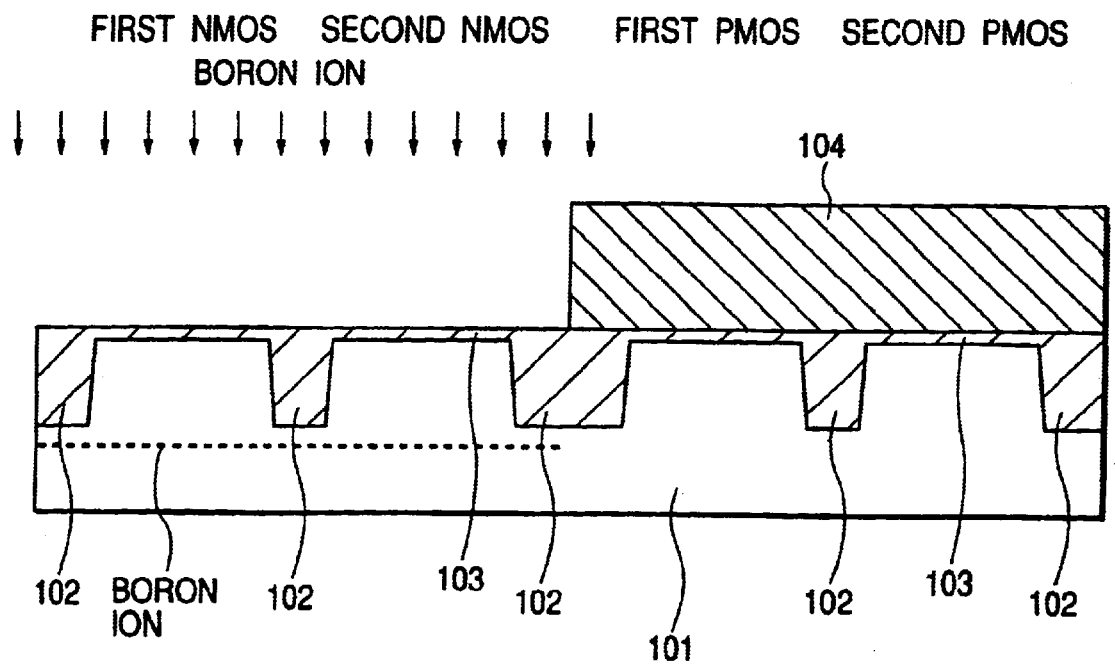
Figure 34:
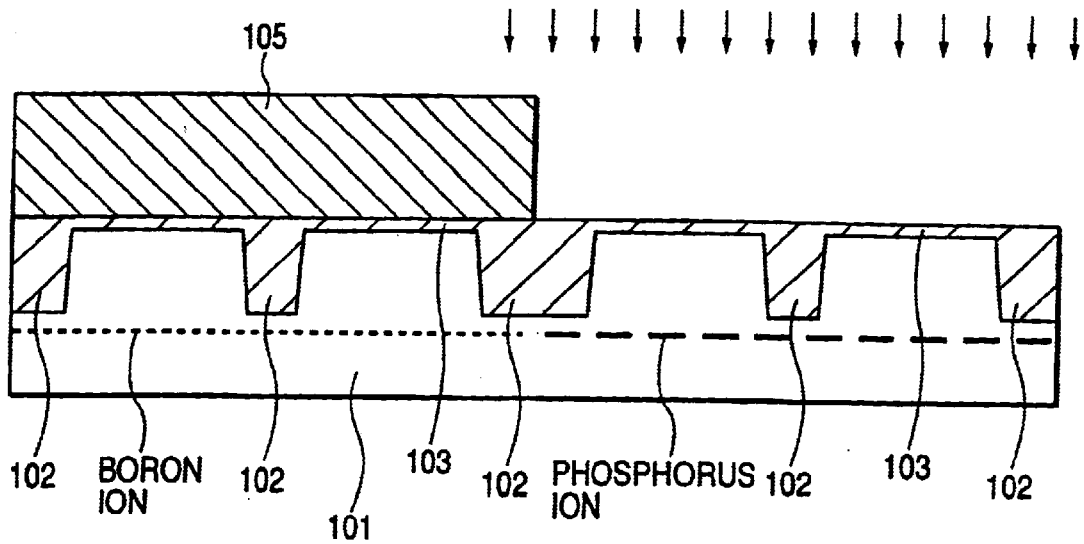
Figure 35:
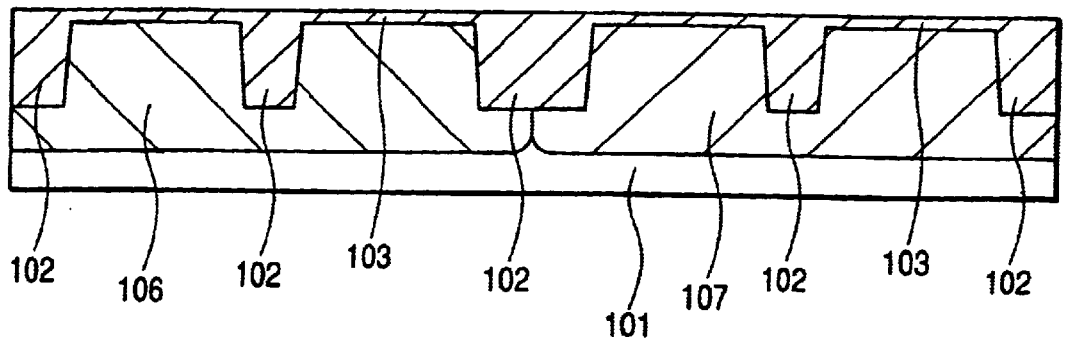
Figure 36:
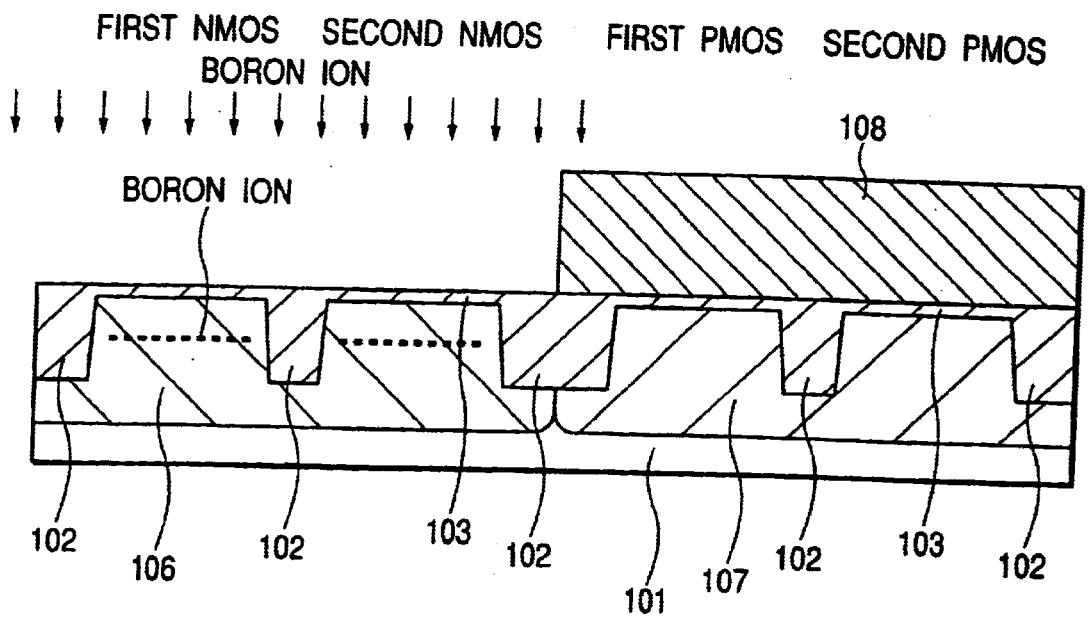
Figure 37:
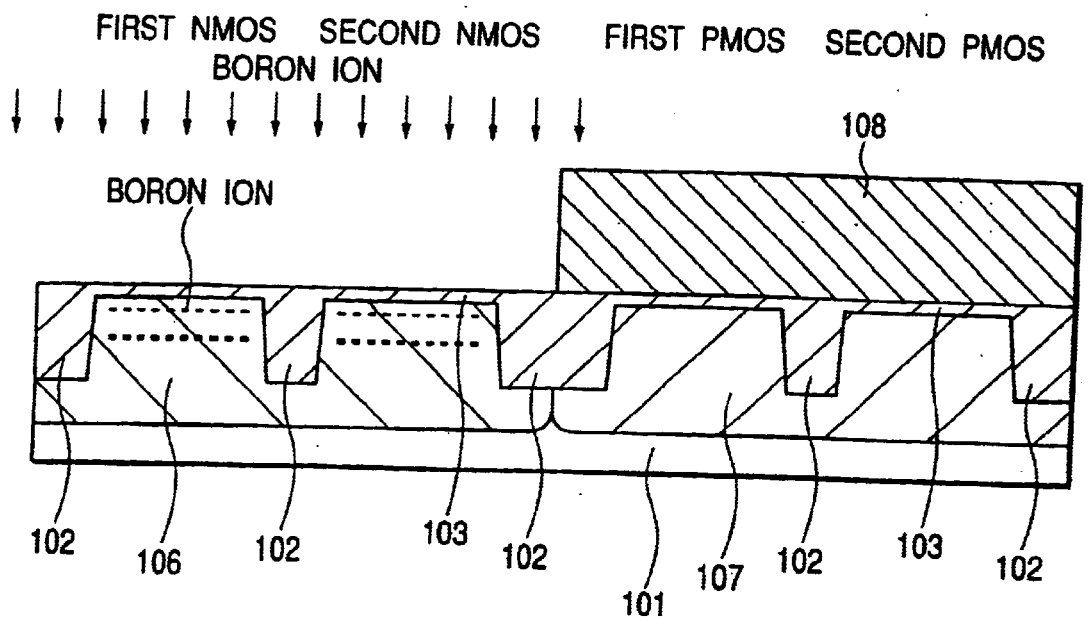
Figure 38:
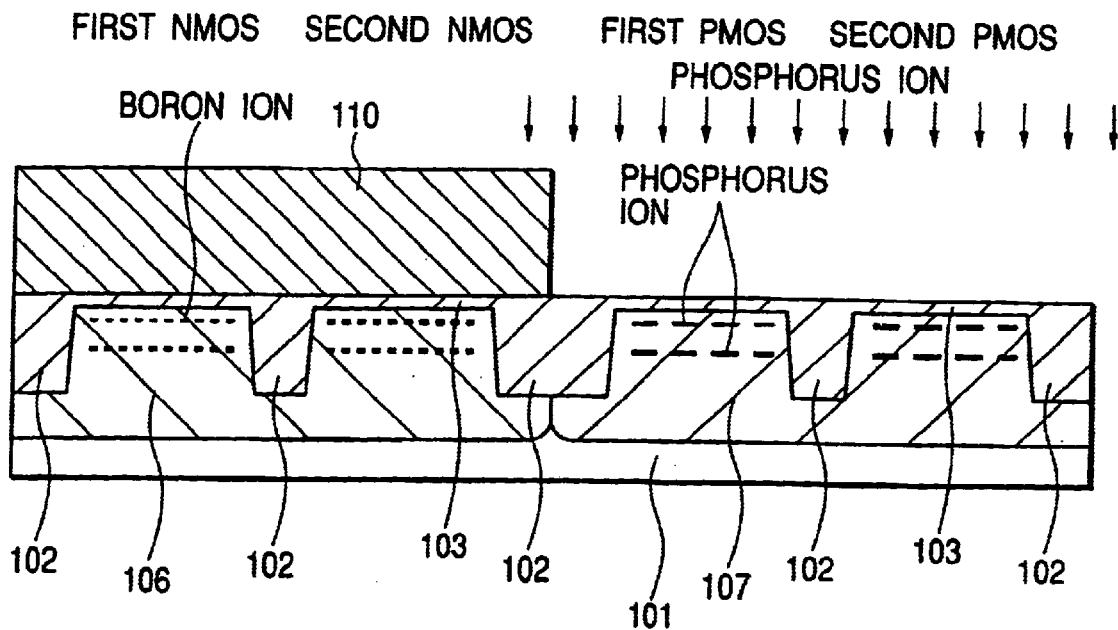
Figure 39:
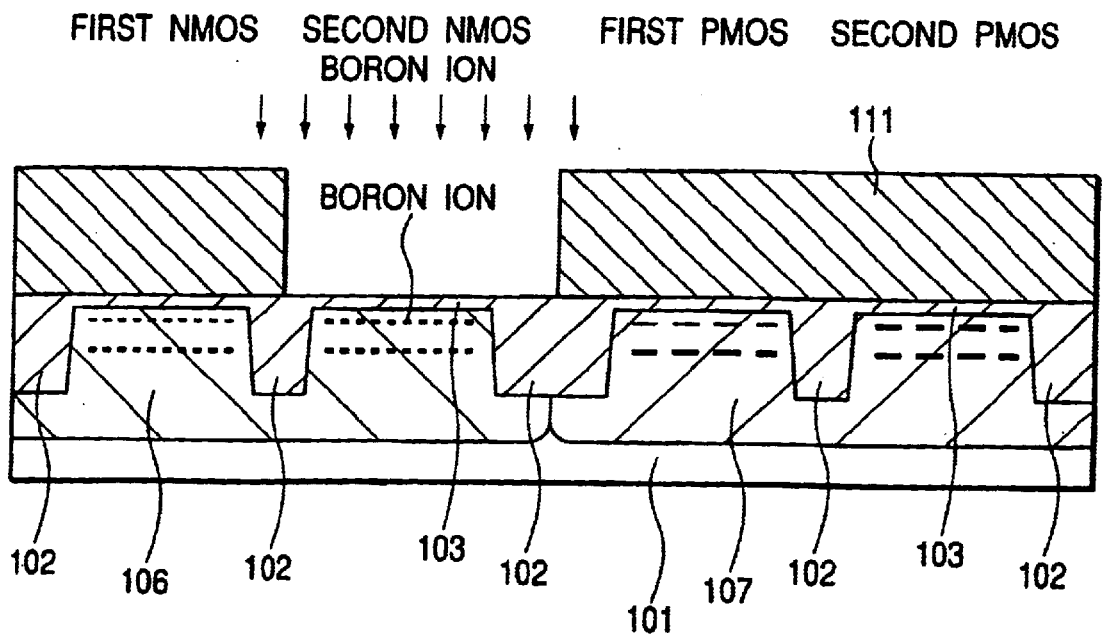
Figure 42:
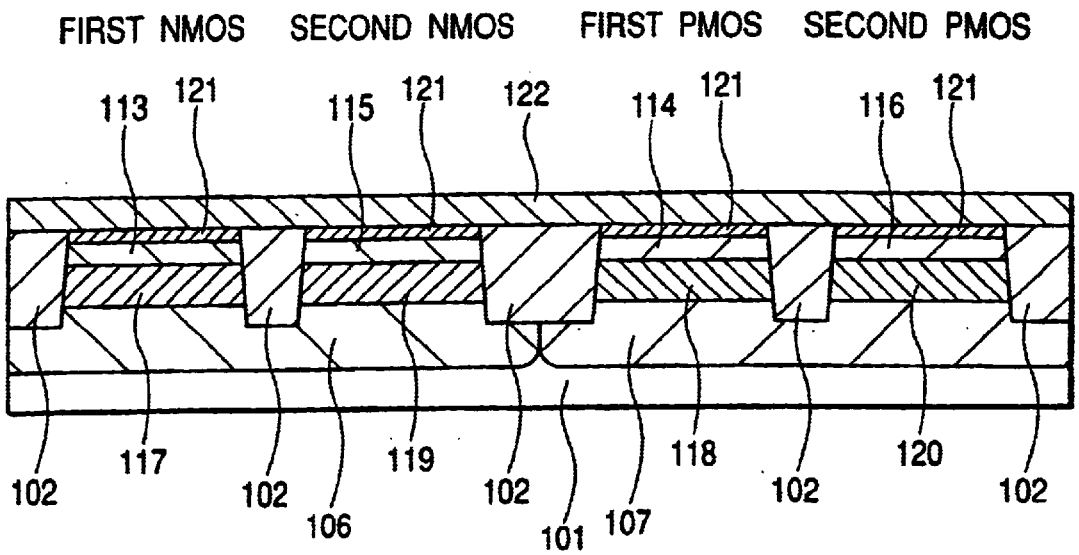
Figure 43:
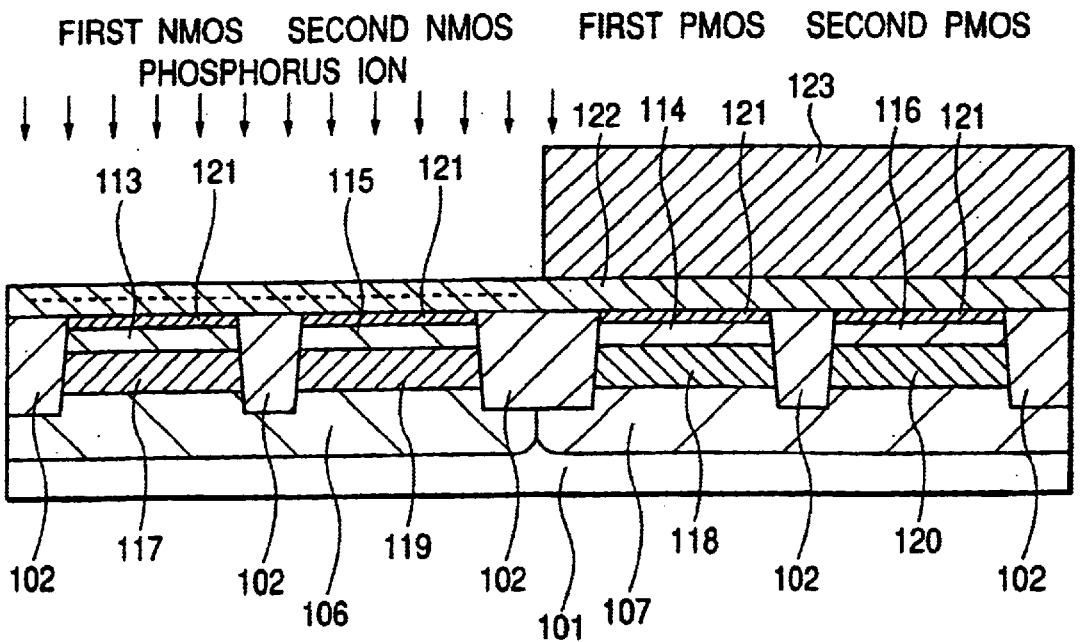
Figure 44:
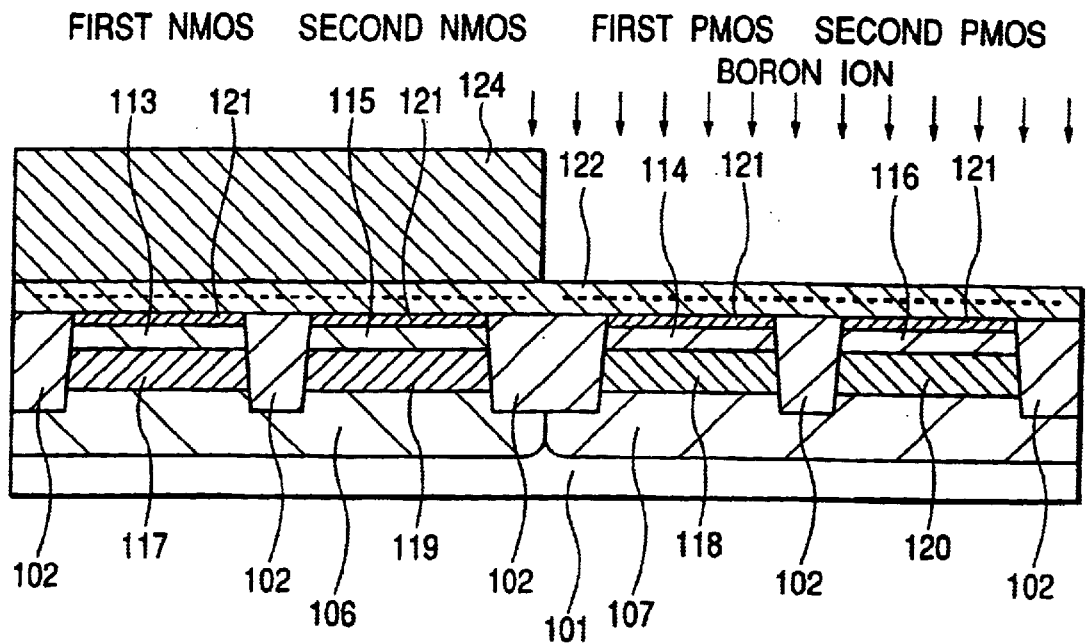
Figure 45:
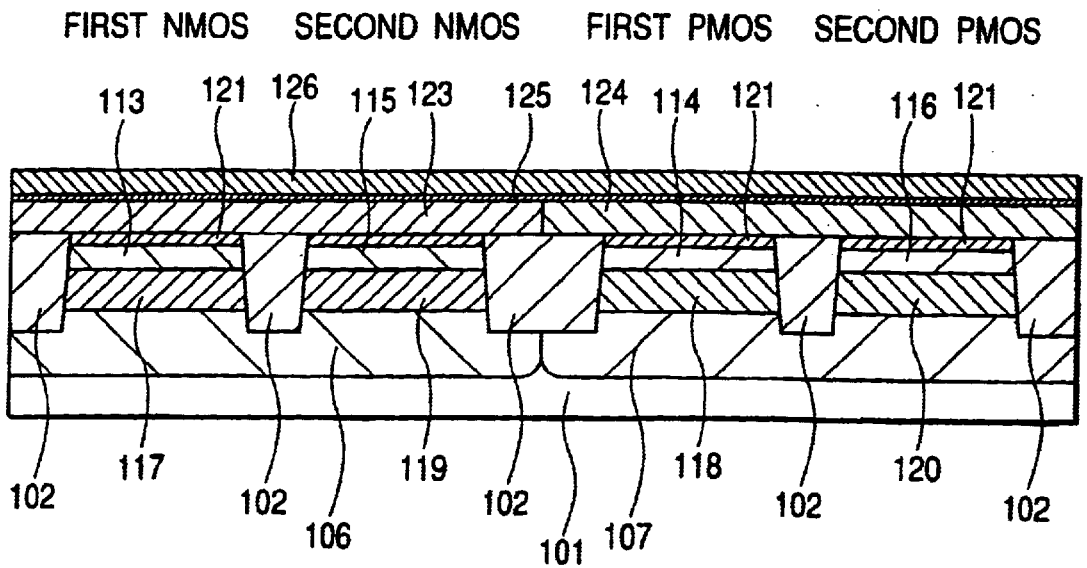
Figure 46:
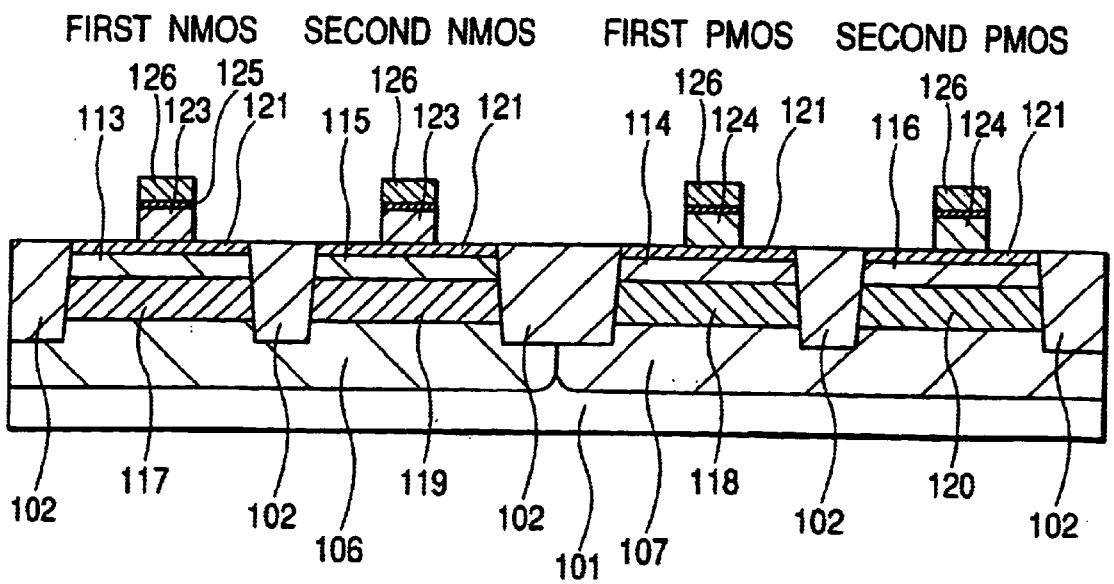
Figure 47:
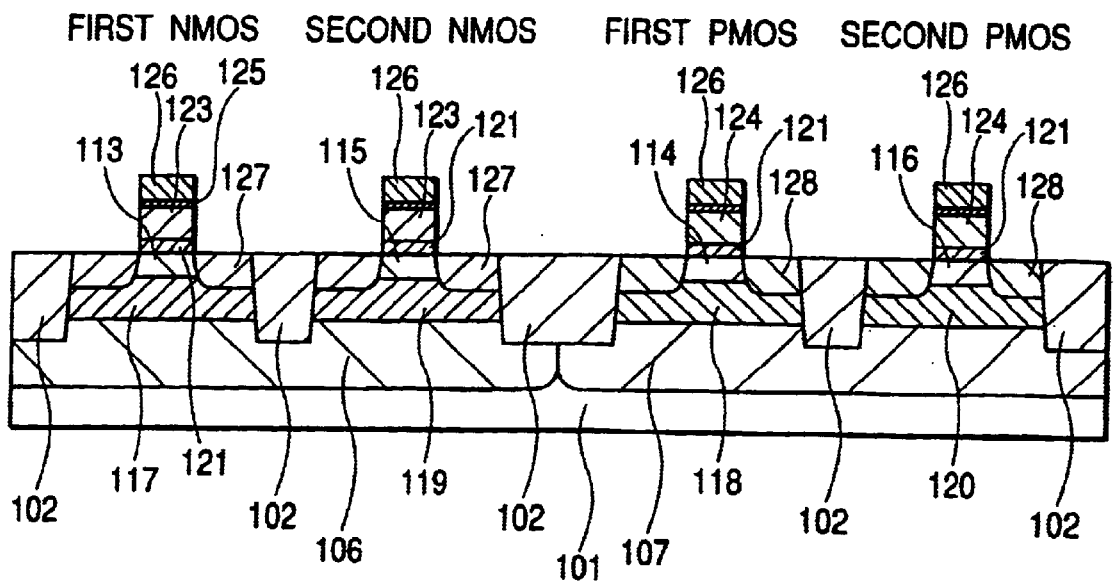

The present embodiment is suitable for a semiconductor integrated circuit device such as an LSI device of mixed mounting type shown in FIG. 32, the device requiring a plurality of threshold voltages.

According to the embodiment, only one photolithography step is required for each of the n-type and p-type channels in the wall ion implantation, the channel ion implantation for threshold voltage control, and the ion implantation for the gate electrode doping. Therefore, the LSI manufacturing steps can be remarkably reduced when compared with the prior art in which the photolithography step is conducted for each associated step.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of manufacturing a semiconductor integrated circuit device including a semiconductor substrate and at least one first transistor having a first conductivity type and at least one second transistor having a second conductivity type opposite to the first conductivity type, the first and second transistors being formed on the semiconductor substrate, comprising:
    a first step of forming a gate insulating film on one surface of the semiconductor substrate;
    a second step of depositing a gate material film using material for gates on the gate insulating film;
    a third step of forming first photoresist covering a second area in which the second transistor is formed, the first photoresist having an opening in a first area in which the first transistor is formed;
    a fourth step of conducting ion implantation using the first photoresist as a mask for formation of a well, threshold voltage control, and gate doping of the first transistor;
    a fifth step of removing the first photoresist;
    a sixth step of forming second photoresist covering the first area and having an opening in the second area;
    a seventh step of conducting ion implantation using the second photoresist as a mask for formation of a well, threshold voltage control, and gate doping of the second transistor; and
    an eighth step of removing the second photoresist.

2. A method of manufacturing a semiconductor integrated circuit device according to claim 1, wherein:
    the fourth step comprises the step of conducting ion implantation using the first photoresist as a mask to form a punchthrough stopper of the first transistor; and
    the eighth step comprises the step of conducting ion implantation using the second photoresist as a mask to form a punchthrough stopper of the second transistor.

3. A method of manufacturing a semiconductor integrated circuit device according to claim 1, further comprising:
    a ninth step of conducting impurity activation annealing to activate impurity implanted by each of the ion implantation; and
    a tenth step of processing the gate material film to form a gate for each of the first and second transistors.

4. A method of manufacturing a semiconductor integrated circuit device according to claim 2, further comprising:
    a ninth step of conducting impurity activation annealing to activate impurity implanted by each of the ion implantation; and
    a tenth step of processing the gate material film to form a gate for each of the first and second transistors.

5. A method of manufacturing a semiconductor integrated circuit device according to claim 1, wherein:
    the ion implantation for formation of a well and threshold voltage control for the first transistor and the ion implantation for gate doping of the second transistor are conducted using impurity of the second conductivity type; and
    the ion implantation for formation of a well and threshold voltage control of the second transistor and the ion implantation for gate doping of the first transistor are conducted using impurity of the first conductivity type.

6. A method of manufacturing a semiconductor integrated circuit device according to claim 2, wherein:
    the ion implantation for formation of a well, formation of a punchthrough stopper, and threshold control of the first transistor and the ion implantation for gate doping of the second transistor are conducted using impurity of the second conductivity type; and
    the ion implantation for formation of a well, formation of a punchthrough stopper, and threshold control of the second transistor and the ion implantation for gate doping of the first transistor are conducted using impurity of the first conductivity type.

7. A method of manufacturing a semiconductor integrated circuit device according to claim 1, wherein each of the fourth and seventh steps conducts the ion implantation for formation of a well, the ion implantation for threshold voltage control, and the ion implantation for gate doping in this order.

8. A method of manufacturing a semiconductor integrated circuit device according to claim 1, wherein each of the fourth and seventh steps conducts the ion implantation for formation of a well, the ion implantation for a punchthrough stopper, the ion implantation for threshold voltage control, and the ion implantation for gate doping in this order.

9. A method of manufacturing a semiconductor integrated circuit device including a semiconductor substrate and at least one NMIS transistor and at least one PMIS transistor formed on the semiconductor substrate, comprising:
    a step of forming a gate insulating film on one surface of the semiconductor substrate;
    a step of depositing a silicon thin film using silicon;
    a step of conducting ion implantation, using first photoresist as a mask, to form a p-type well in an NMIS transistor area;
    a step of conducting ion implantation, using the first photoresist as a mask, onto an NMIS transistor area for threshold voltage control;
    a step of conducting ion implantation, using the first photoresist as a mask, to implant n-type ions onto the silicon thin film in an NMIS transistor area;

a step of removing the first photoresist;

a step of conducting ion implantation, using second photoresist as a mask, to form an n-type well in a PMIS transistor area;

a step of conducting ion implantation, using the second photoresist as a mask, onto a PMIS transistor area for threshold voltage control;

a step of conducting ion implantation, using the second photoresist as a mask, to implant p-type ions onto the silicon thin film in a PMIS transistor area;

a step of removing the second photoresist; and a step of patterning a gate electrode in the silicon thin film.

10. A method of manufacturing a semiconductor integrated circuit device according to claim 9, further comprising the step of depositing a low resistivity conductive film on the silicon thin film, wherein the gate electrode is a multilayer film including the silicon thin film and the low resistivity conductive film.

11. A method of manufacturing a semiconductor integrated circuit device according to claim 9, further comprising the step of forming, before the step of forming the gate insulating film, an isolation zone to isolate an NMIS transistor area from a PMIS transistor area.

12. A method of manufacturing a semiconductor integrated circuit device according to claim 9, further comprising the step of forming, after the step of forming the silicon thin film, an isolation zone to isolate an NMIS transistor area from a PMIS transistor area.

13. A method of manufacturing a semiconductor integrated circuit device according to claim 9, wherein the silicon thin film is made of polycrystalline silicon and has a thickness of about 50 nm or less.

14. A method of manufacturing a semiconductor integrated circuit device according to claim 1, wherein the silicon thin film is made of amorphous silicon and has a thickness of about 50 nm or less.

15. A method of manufacturing a semiconductor integrated circuit device according to claim 10, wherein the low resistivity conductive film is made of refractory metal such as wolfram.

16. A method of manufacturing a semiconductor integrated circuit device including a semiconductor substrate, first and second NMIS transistors and first and second PMIS transistors formed on the semiconductor substrate, comprising:

a step of forming a gate insulating film on one surface of the semiconductor substrate;

a step of depositing a silicon thin film using silicon;

a step of covering with first photoresist areas in which the first and second NMIS transistors are formed;

a step of conducting ion implantation, using the first photoresist as a mask, to implant n-type impurity onto the first and second PMIS transistor forming areas;

a step of conducting ion implantation, using the first photoresist as a mask, to implant n-type impurity onto channel forming areas of the first and second PMIS transistors;

a step of implanting p-type impurity onto the silicon thin film using the first photoresist as a mask;

a step of removing the first photoresist;

a step of covering with second photoresist areas in which the first and second PMIS transistors are formed;

a step of conducting ion implantation, using the second photoresist as a mask, to implant p-type impurity onto the first and second NMIS transistor forming areas;

a step of conducting ion implantation, using the second photoresist as a mask, to implant p-type impurity onto channel forming areas of the first and second NMIS transistors;

a step of implanting n-type impurity onto the silicon thin film using the second photoresist as a mask;

a step of removing the second photoresist;

a step of covering with third photoresist areas in which the first NMIS transistor and the first PMIS transistor are formed;

a step of implanting p-type impurity onto the channel forming areas of the second NMIS and PMIS transistors using the third photoresist as a mask; and a step of removing the third photoresist.

17. A method of manufacturing a semiconductor integrated circuit device according to claim 16, further comprising the step of forming, before the step of forming the gate insulating film, an isolation zone to isolate the first and second NMIS transistors from the first and second PMIS transistors.

18. A method of manufacturing a semiconductor integrated circuit device according to claim 16, further comprising the step of forming, after the step of forming the silicon thin film, an isolation zone to isolate the first and second NMIS transistors from the first and second PMIS transistors.

19. A method of manufacturing a semiconductor integrated circuit device according to claim 16, wherein the silicon thin film is made of polycrystalline silicon and has a thickness of about 50 nm or less.

20. A method of manufacturing a semiconductor integrated circuit device according to claim 16, wherein the silicon thin film is made of amorphous silicon and has a thickness of about 50 nm or less.

21. A method of manufacturing a semiconductor integrated circuit device according to claim 16, further comprising the step of depositing a low resistivity conductive film on the silicon thin film, wherein the gate electrode is a multilayer film including the silicon thin film and the low resistivity conductive film.

22. A method of manufacturing a semiconductor integrated circuit device according to claim 21, wherein the low resistivity conductive film is made of refractory metal such as wolfram.

* * * * *